(12) United States Patent  (10) Patent No.: US 7,780,020 B2
Yoshitaka  (45) Date of Patent: Aug. 24, 2010

(54) ARTICLE TRANSPORT FACILITY

(75) Inventor: Inui Yoshitaka, Omihachiman (JP)

(73) Assignee: Daifuku Co., Ltd., Osaka (JP)

( * ) Notice: Subject to any disclaimer, the term of this patent is extended or adjusted under 35 U.S.C. 154(b) by 1037 days.

(21) Appl. No.: 11/508,120

(22) Filed: Aug. 22, 2006

(65) Prior Publication Data

US 2007/0059131 A1   Mar. 15, 2007

(30) Foreign Application Priority Data

Aug. 30, 2005 (JP) .............................. 2005-249894
Feb. 16, 2006 (JP) .............................. 2006-039575

(51) Int. Cl.
*B66C 19/00* (2006.01)
(52) U.S. Cl. .................. 212/332; 414/282; 414/940
(58) Field of Classification Search ................. 414/266, 414/278, 277, 282, 626, 373, 940; 212/331, 212/332
See application file for complete search history.

(56) References Cited

U.S. PATENT DOCUMENTS

| 4,678,390 A | 7/1987 | Bonneton et al. |
| 4,971,508 A * | 11/1990 | JPX et al. .................... 414/282 |
| 6,077,017 A * | 6/2000 | Durant ....................... 414/254 |

| 2004/0091338 A1* | 5/2004 | Kim ............................ 414/217 |
| 2004/0109746 A1* | 6/2004 | Suzuki ........................ 414/373 |
| 2006/0051192 A1* | 3/2006 | Fujiki .......................... 414/626 |
| 2006/0182553 A1* | 8/2006 | Yamamoto et al. .......... 414/278 |
| 2006/0222479 A1* | 10/2006 | Shiwaku et al. ............. 414/267 |
| 2008/0240892 A1* | 10/2008 | Courtois et al. ........ 414/225.01 |

FOREIGN PATENT DOCUMENTS

DE   3714638   12/1988
JP   10-45213   2/1998

* cited by examiner

*Primary Examiner*—Charles A Fox
(74) *Attorney, Agent, or Firm*—The Webb Law Firm

(57) ABSTRACT

An article transport facility comprises an article transporting mobile body movable along a moving path and having an article holding unit;

an article support for article storage, the article support movable between an article transfer position for receiving an article from the holding unit of the mobile body and transferring the article to the holding unit, and an article storage position; and a operating device provided on the mobile body for moving the article support between the article storage position and the article transfer position when the mobile body is at an article transfer location corresponding to a location of the article support.

15 Claims, 21 Drawing Sheets

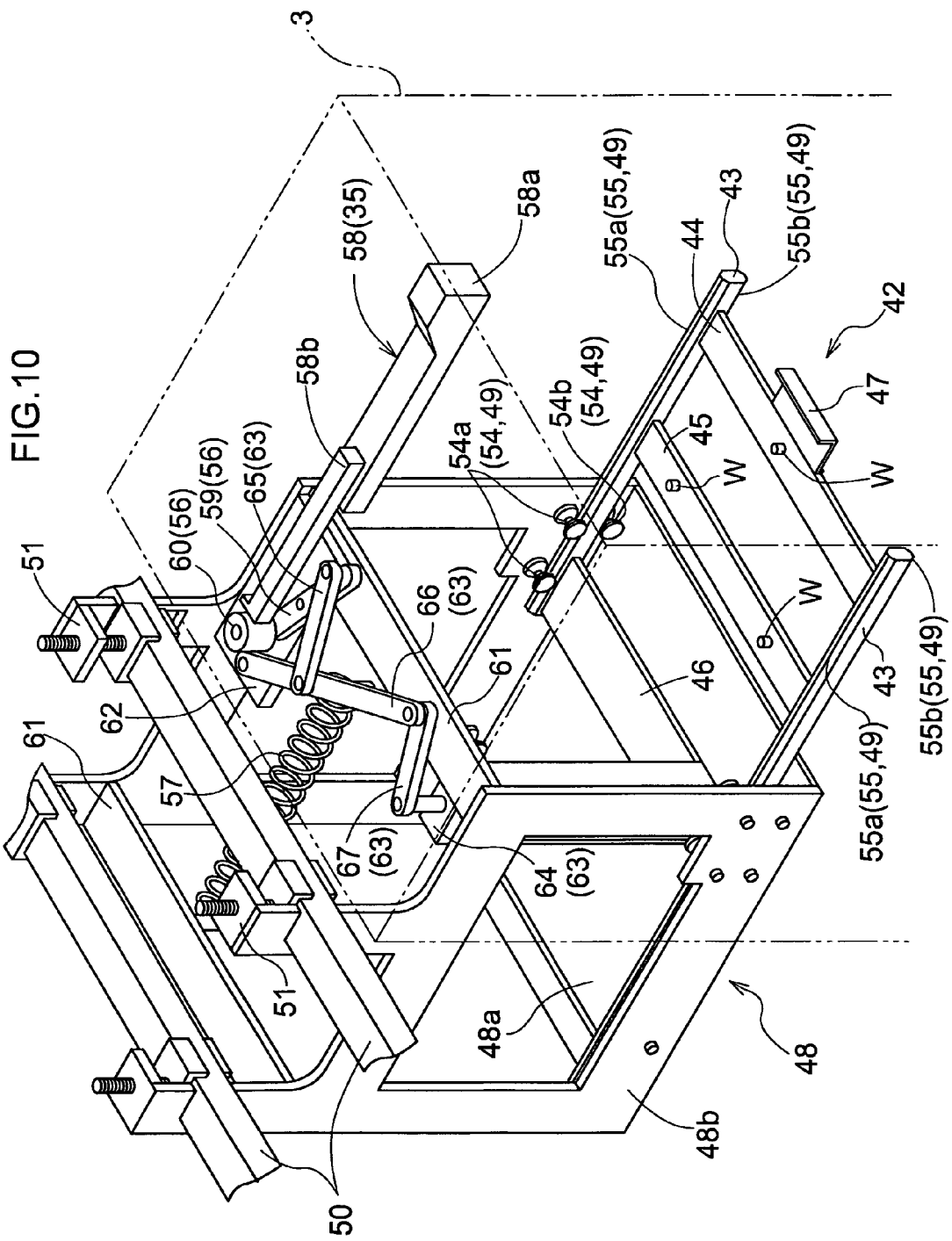

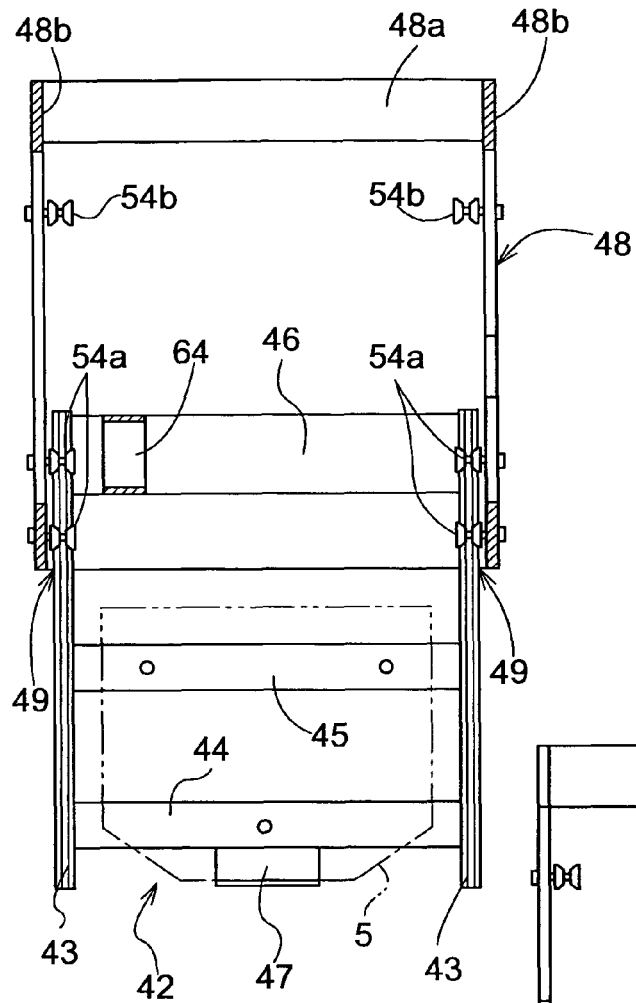
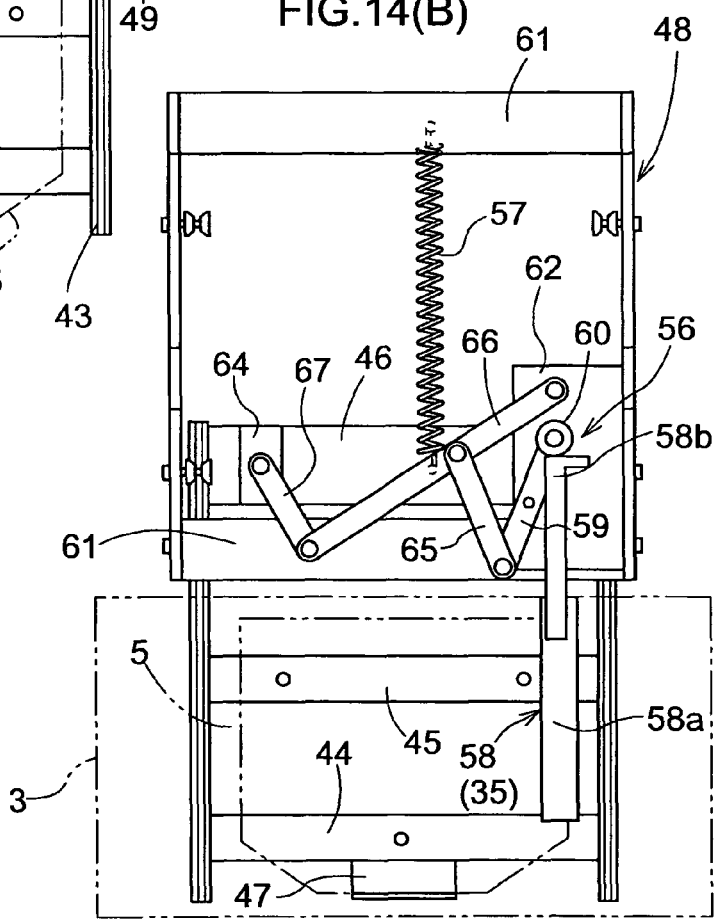

ARTICLE TRANSPORT FACILITY

BACKGROUND OF THE INVENTION

This invention relates to an article transport facility including an article-carrying mobile body movable along a moving path and having an article holder, and article supports for article storage movable between an article transfer position for receiving articles from the article holder of the mobile body and for passing articles to the article holder, and an article storage position.

The above article transport facility includes a plurality of article transfer stations arranged along the moving path. The mobile body moves along the moving path to transport articles between the stations.

The article supports are provided to keep temporarily articles to be transported to the stations. The article supports are usually located in positions for article storage such as at a side of the moving path, not to interfere with movement of the mobile body. When articles are stored on the article supports or when articles are transported from the article supports, the article supports are moved from the article storage position to the article transfer position, to transfer articles from the holder of the mobile body to the article supports, and transfer articles from the article supports to the holder.

Conventionally, such an article transport facility has a guide rail serving as the moving path installed on the ceiling, a link mechanism pivotable about a horizontal axis relative to the ceiling and supporting an article support deck acting as the article support to be movable between the article storage position and article transfer position, and a hydraulic cylinder disposed between the ceiling and the link mechanism for moving the article support between the article storage position and the article transfer position (see Japanese Patent Publication (Unexamined) H10-45213, for example).

In this conventional article transport facility, when storing an article on the article support, with the mobile body stopped in an article transfer location, the hydraulic cylinder is driven to rock the link mechanism about the horizontal axis to move the article support from the article storage position to the article transfer position. After transferring the article from the holder of the mobile body to the article support, the hydraulic cylinder is driven to swing the link mechanism about the horizontal axis to move the article support from the article transfer position to the article storage position.

Also when causing the mobile body to transport an article stored on the article support, the hydraulic cylinder is driven to move the article support from the article storage position to the article transfer position to transfer the article from the article support to the holder of the mobile body. Thereafter, the hydraulic cylinder is driven to move the article support from the article transfer position to the article storage position.

In order to provide the article support, the above conventional article transport facility has, arranged at a side of the moving path, the hydraulic cylinder which moves the article support between the article storage position and the article transfer position, in addition to the link mechanism which supports the article support to be capable of position changing. Consequently, an increased number of components are arranged at a side of the moving path, thereby enlarging an installation space as well as complicating the construction.

SUMMARY OF THE INVENTION

This invention has been made having regard to the above noted drawbacks, and its object is to provide an article transport facility which can move an article support between an article storage position and an article transfer position while realizing a simplified construction.

An article transport facility according to this invention comprises:

an article transporting mobile body movable along a moving path and having an article holding unit;

an article support for article storage movable between an article transfer position for receiving an article from the holding unit of the mobile body and passing the article to the holding unit, and an article storage position; and an operating means provided on the mobile body for moving the article support between the article storage position and the article transfer position when the mobile body stands still in an article transfer location corresponding to the article support.

Thus, the article support can be moved between the article storage position and article transfer position by the operating means provided on the mobile body. It is unnecessary to install a device at a side of the moving path for switching the article support between the article storage position and article transfer position. It is therefore possible to reduce the number of components installed at a side of the moving path. The article transport facility provided by this invention can move the article support between the article storage position and article transfer position while realizing a simplified construction.

BRIEF DESCRIPTION OF THE DRAWINGS

FIG. 10 is a perspective view of an article support and a fixed frame;

FIG. 14 is a plan view of the fixed frame and the fixed frame;

DETAILED DESCRIPTION OF PREFERRED EMBODIMENTS

Article transport facilities according to this invention will be described with reference to the drawings.

First Embodiment

Figure 1:
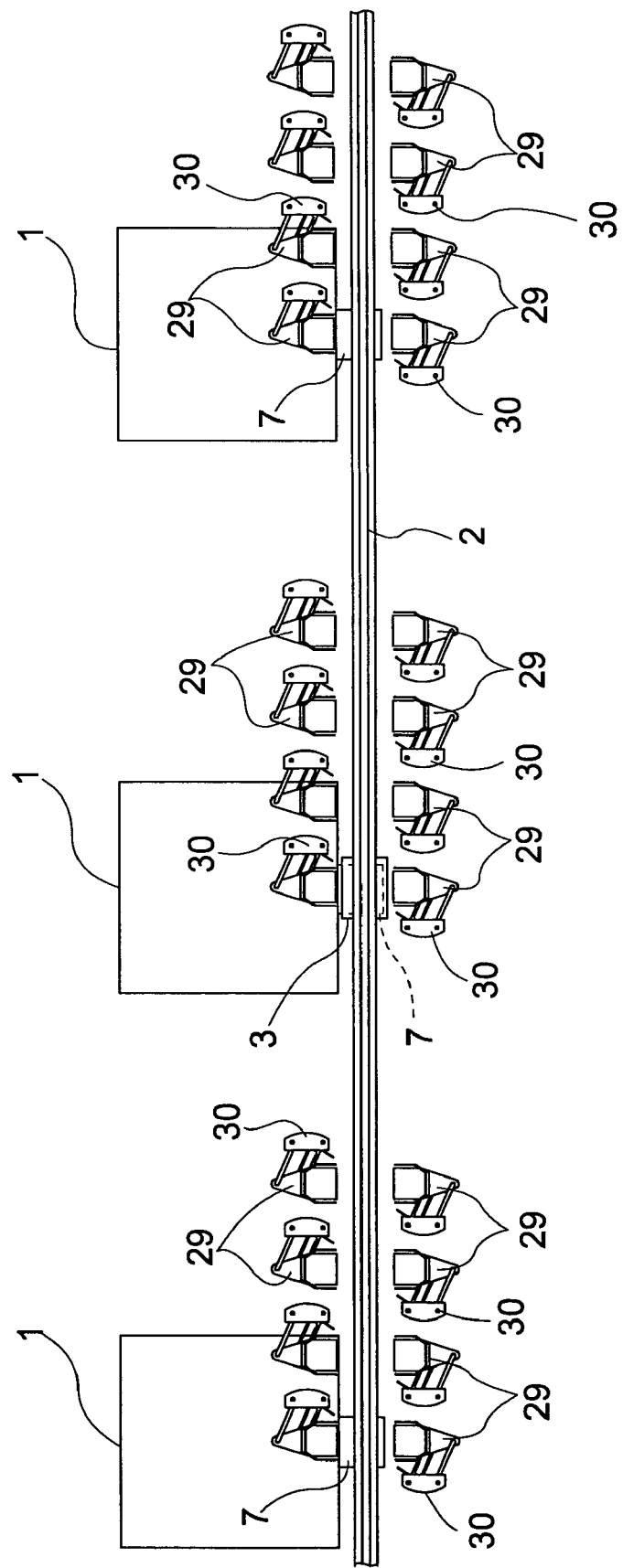
FIG. 1 is a plan view of an article transport facility.
Figure 2:
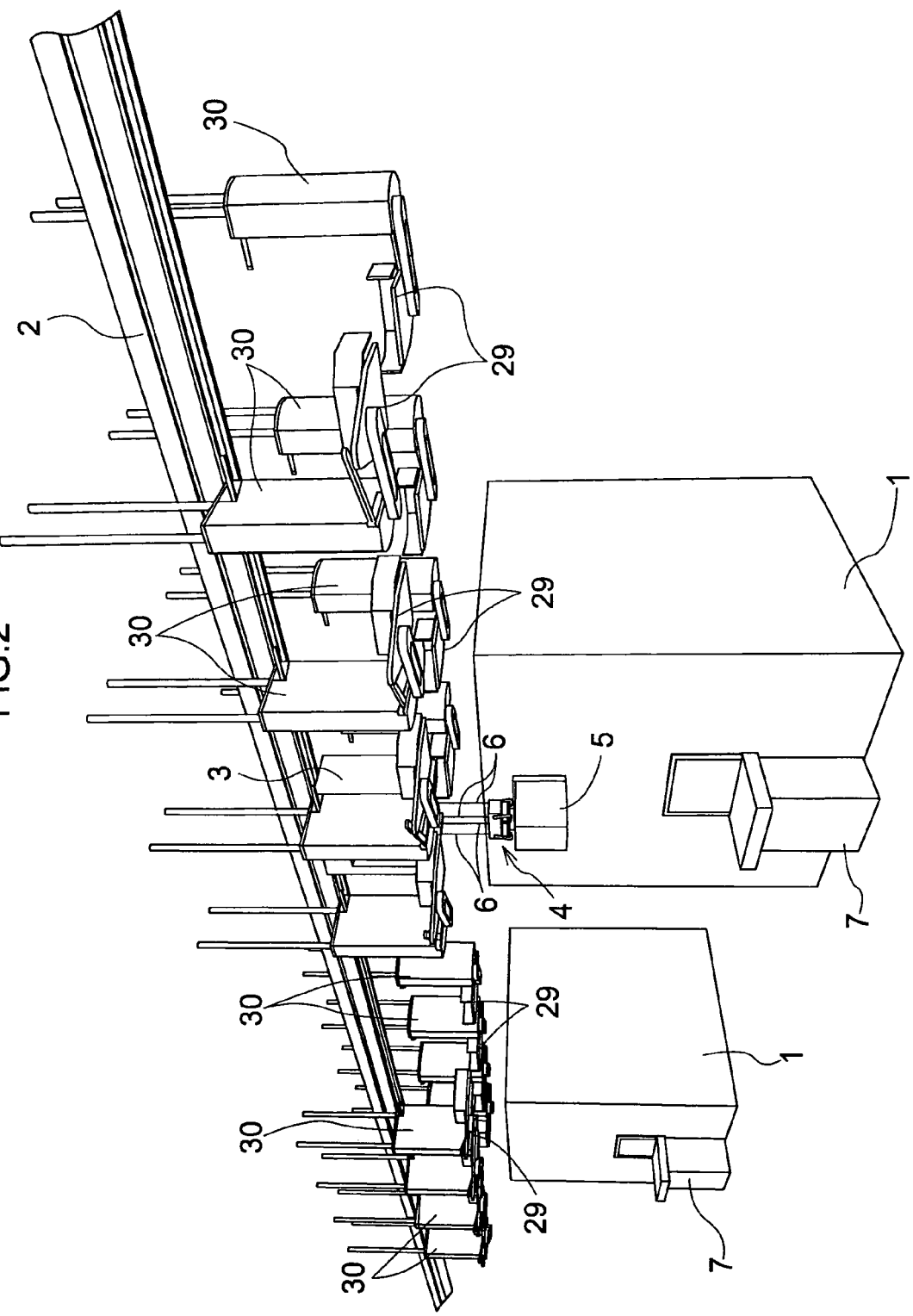
FIG. 2 is a perspective view of the article transport facility.

As shown in FIGS. 1 and 2, an article transport facility in the first embodiment includes a guide rail 2 installed as a moving path extending by way of a plurality of article processing units 1, and a transport vehicle 3 acting as a mobile body movable along the guide rail 2 for transporting articles. The articles herein are containers 5 storing semiconductor substrates, and the transport vehicle 3 transports the containers 5 between the plurality of article processing units 1. Each article processing units 1 performs a predetermined process for partly finished goods in the course of manufacturing semiconductor substrates, for example.

The transport vehicle 3 has a gripper 4 for vertically movably gripping a container 5 in a suspended state. The gripper 4 acts as a holder for holding a container 5.

Figure 3:
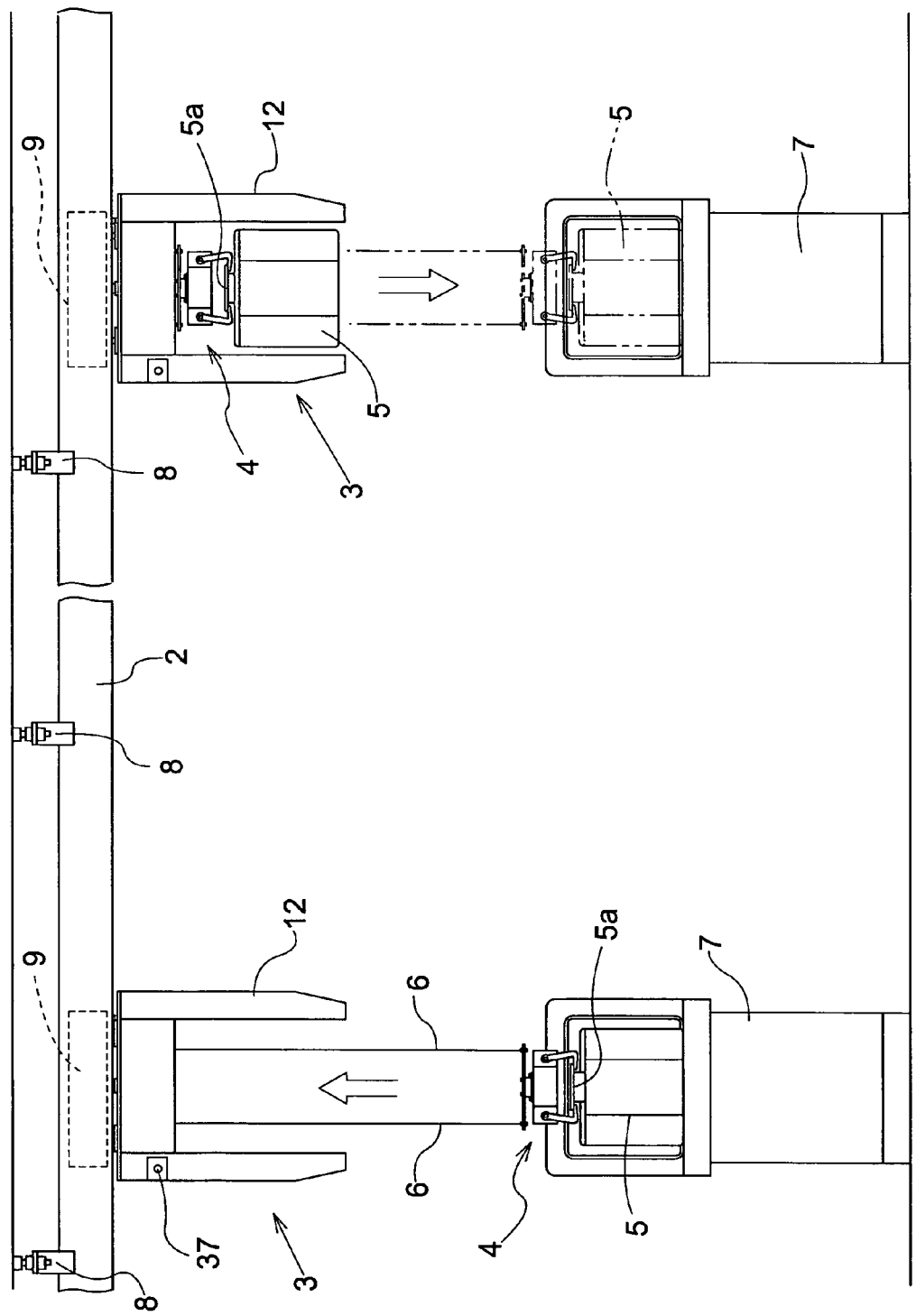
FIG. 3 is a side view of a transport vehicle and a station.

As shown in FIG. 3, with the transport vehicle 3 standing still, the gripper 4 is vertically movable, by winding and unwinding wires 6, between an upper position adjacent the transport vehicle 3, and a lower position for article transfer to and from an article transfer station 7 disposed below the transport vehicle 3.

FIG. 3 shows the gripper 4 being lowered from the upper position to the lower position at the right-hand side, and the gripper 4 being raised from the lower position to the upper position at the left-hand side.

The station 7 serves to receive containers 5 from the transport vehicle 3 for a predetermined process by the article processing unit 1, or to deliver containers 5 having undergone the predetermined process by the article processing unit 1 to the transport vehicle 3. The station 7 is in the form of a support table provided for each of the article processing units 1.

The transport vehicle 3 moves along the guide rail 2, with the gripper 4 placed in the upper position. With the transport vehicle 3 stopped in a stopping location corresponding to a station 7 for transfer, among the plurality of stations 7, an article is transferred to or from this station 7 by vertically moving the gripper 4 between the upper position and the lower position.

Figure 4:
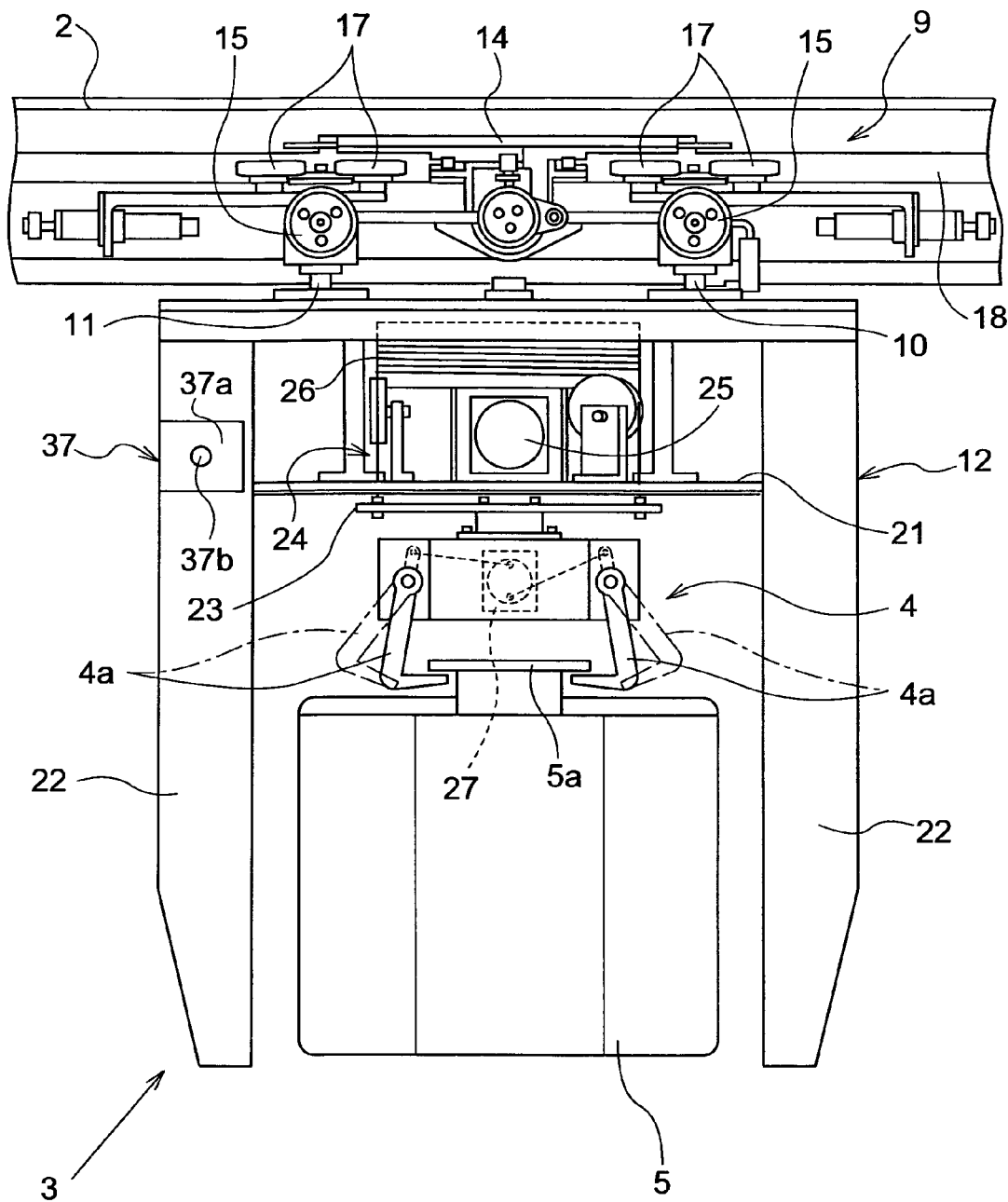
FIG. 4 is a side view of the transport vehicle.
Figure 5:
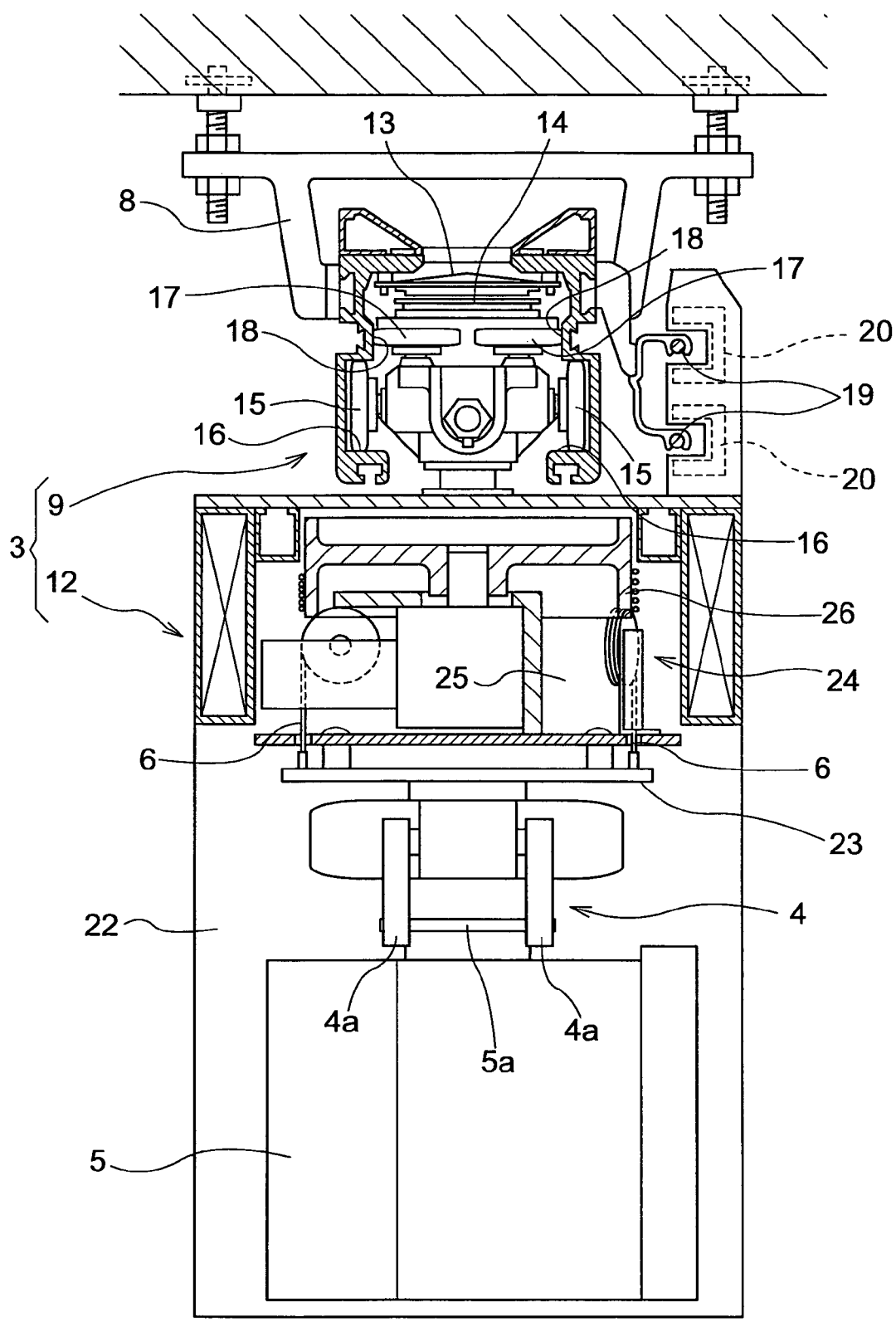
FIG. 5 is a front view in vertical section of the transport vehicle.

As shown in FIGS. 3 through 5, the guide rail 2 is fixed to a ceiling by guide rail brackets 8. FIG. 4 is a side view of the transport vehicle 3, FIG. 5 is a front view in vertical section of the transport vehicle 3.

The transport vehicle 3 includes an upper vehicle body 9 located in an inner space of the guide rail 2, and a lower vehicle body 12 located under the guide rail 2, which are connected together by fore and aft connecting rods 10 and 11.

The upper vehicle body 9 has a primary coil 14 disposed close and opposite to a magnet 13 mounted in the inner space of the guide rail 2. The upper vehicle body 9 is the linear motor type propelled by a linear motor formed of the magnet 13 and primary coil 14. The transport vehicle 3 is movable along the guide rail 2 by this propelling force.

In the inner space of the guide rail 2, running guideways 16 are formed for guiding running wheels 15 of the upper vehicle body 9, and anti-swing guideways 18 for guiding anti-swing wheels 17 of the upper vehicle body 9.

The guide rail 2 has feeder lines 19, and the upper vehicle body 9 has receiving coils 20. The feeder lines 19 supplied with AC generate magnetic fields, which cause the receiving coils 20 to generate power required by the transport vehicle 3. Thus, power is supplied in a non-contact mode.

In this embodiment, the mode for driving the upper vehicle body 9 is the linear motor type that obtains propelling force from a linear motor. Alternatively, for example, an electric motor may be provided for rotating the running wheels 15, and the upper vehicle body 9 may be driven by rotating the running wheels 15 with the electric motor.

The lower vehicle body 12 includes fore and aft frames 21 extending in the fore and aft direction, and a pair of front and rear vertical frames 22 extending downward from forward ends and rearward ends of the fore and aft frames 21. The lower vehicle body 12 is channel-shaped opening downward in side view, with the gripper 4 disposed at the middle in the fore and aft direction.

The gripper 4 is attached to a lift member 23 vertically movable relative to the upper vehicle body 9. The lift member 23 is supported to be vertically movable by a lift control mechanism 24 attached to the fore and aft frames 21.

The lift control mechanism 24 has four wires 6 wound around a rotating drum 26 rotatable by a drum driving motor 25. The lift control mechanism 24 rotates the rotating drum 26 forward and backward to wind and unwind the four wires 6 simultaneously, thereby moving the lift member 23 up and down while maintaining the lift member 23 in a substantially horizontal position.

Although this embodiment shows the example of winding the wires 6 around the rotating drum 26, the lift member 23 may be vertically moved, for example, by belts wound around the rotating drum 26. Thus, the wires 6 may be replaced with belts.

The gripper 4 includes a pair of gripping elements 4a for gripping a flange 5a of each container 5. The pair of gripping elements 4a are switchable, with forward and backward rotations of a gripping motor 27, between a gripping position for gripping the flange 5a by the gripping elements 4a rocking toward each other (solid lines in FIG. 4) and a release position for releasing the flange 5a by the gripping elements 4a rocking away from each other (dotted lines in FIG. 4).

The gripper 4 is attached to the lift member 23 to be swivelable about a vertical axis. Though not shown, a swivel motor is provided for swiveling the gripper 4.

Figure 6:
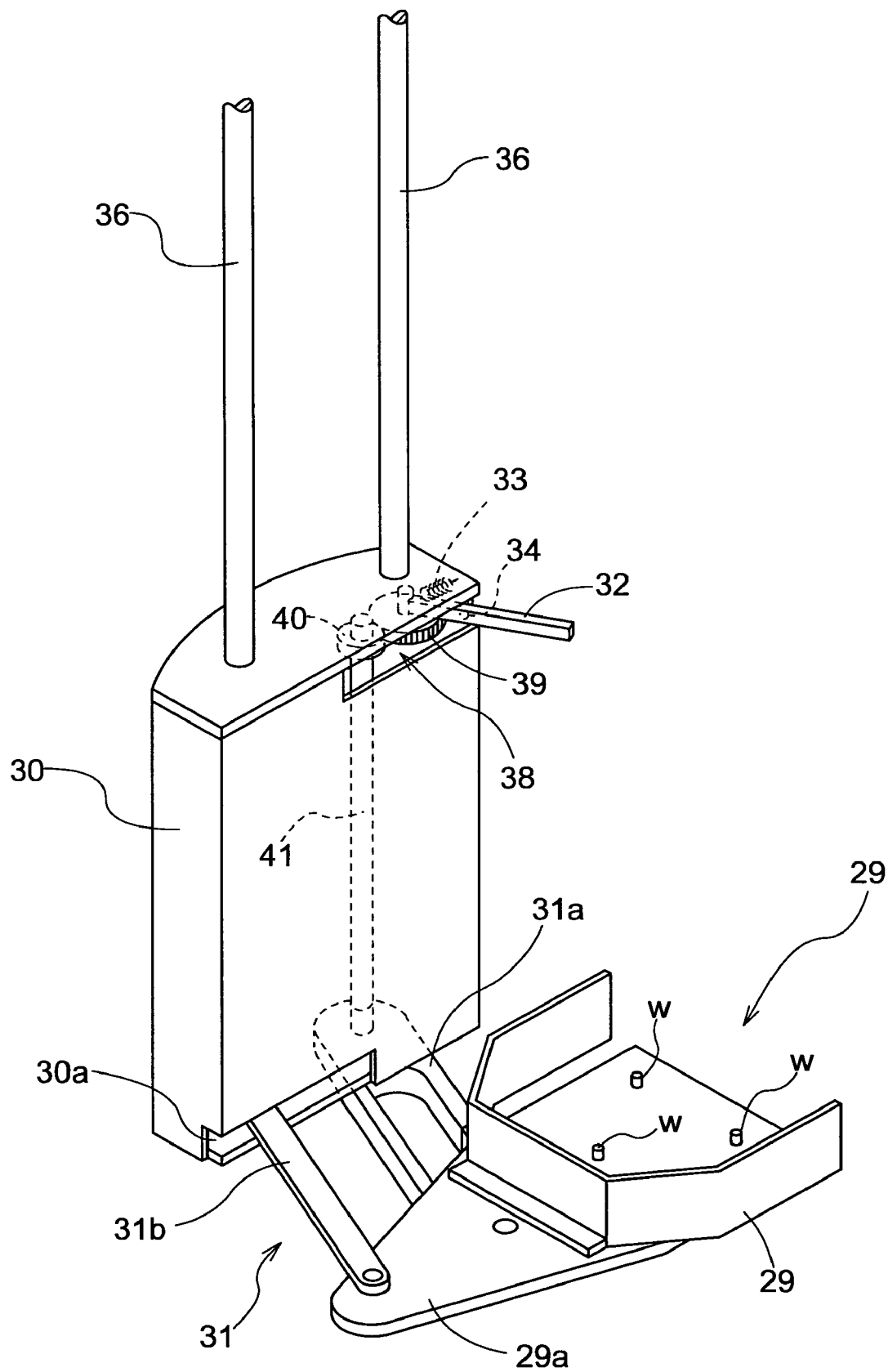
FIG. 6 is a perspective view of an article support.

In order to keep temporarily the containers 5 transported to the stations 7, as shown in FIGS. 1 and 2, a plurality of article supports 29 for article storage are arranged at both sides of the guide rail 2. These article supports 29 are arranged along the guide rail 2. As shown in FIG. 6, each article support 29 includes a support portion 29a for supporting a container 5, and a restrictor wall 29b for restricting horizontal movement of the container 5 placed on the support portion 29a. The container 5 placed on the support portion 29a is supported as positioned by positioning pins W.

Figure 7A:
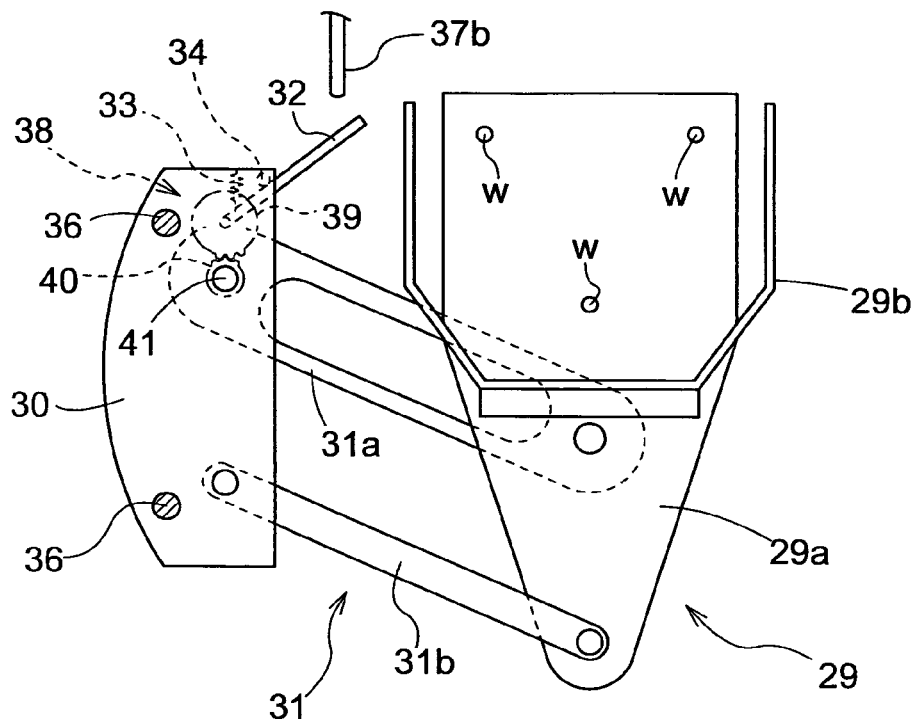
FIG. 7 is a plan view of the article support.
Figure 7B:
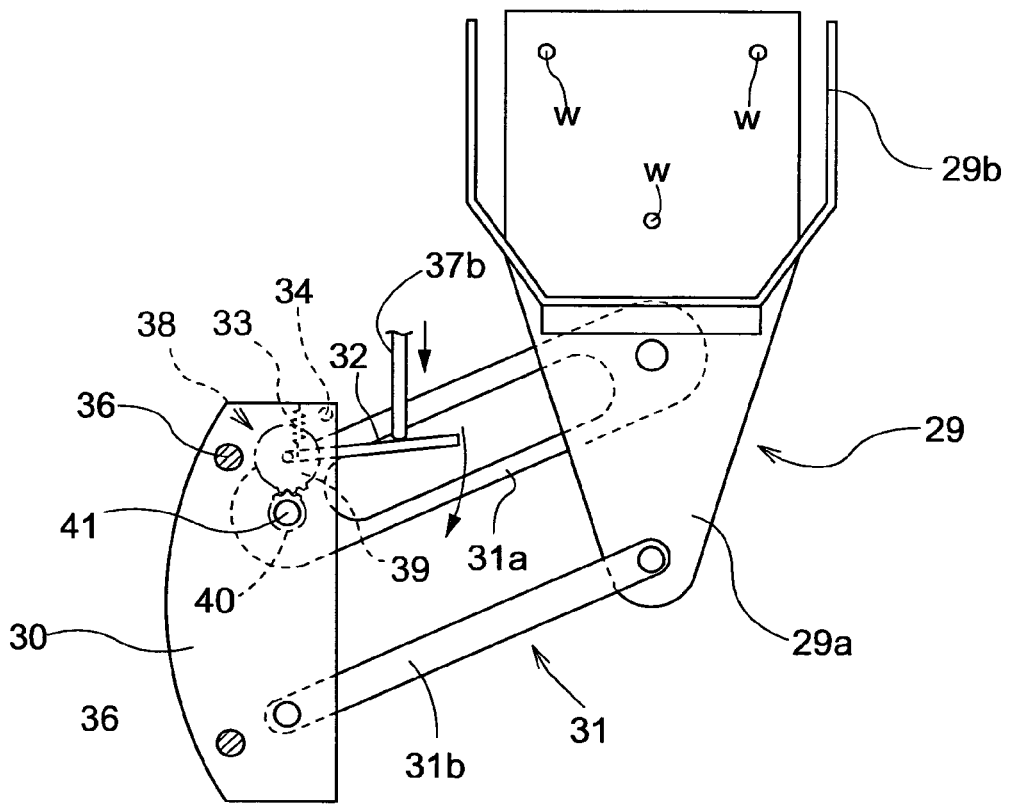
Figure 8A:
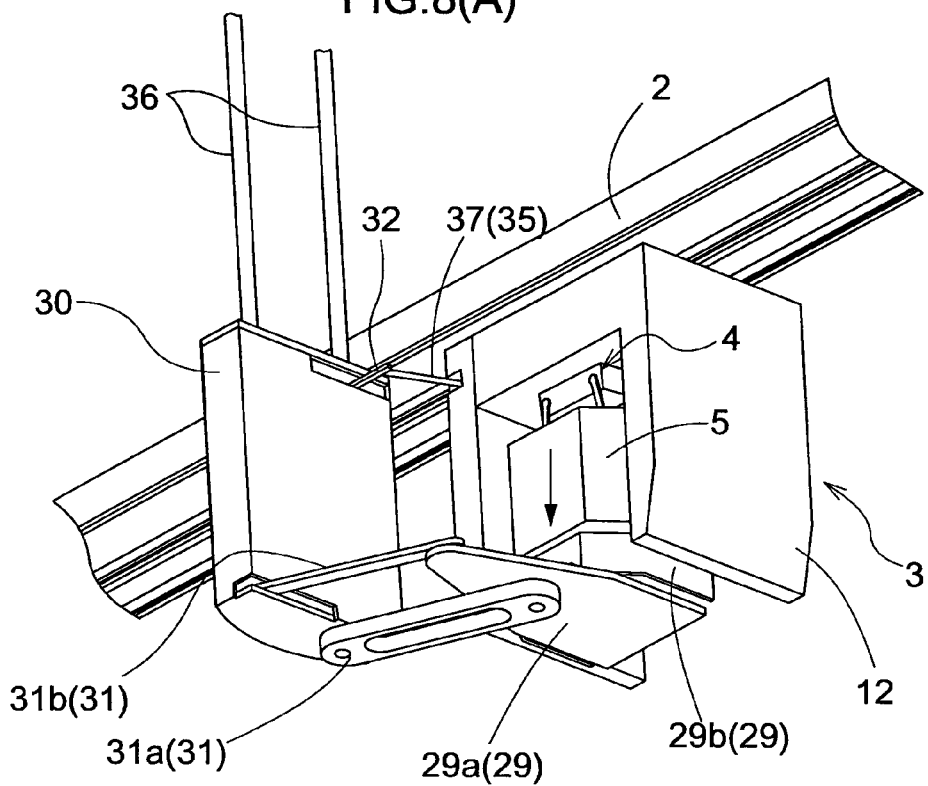
FIG. 8 is a perspective view showing the transport vehicle and article support.
Figure 8B:
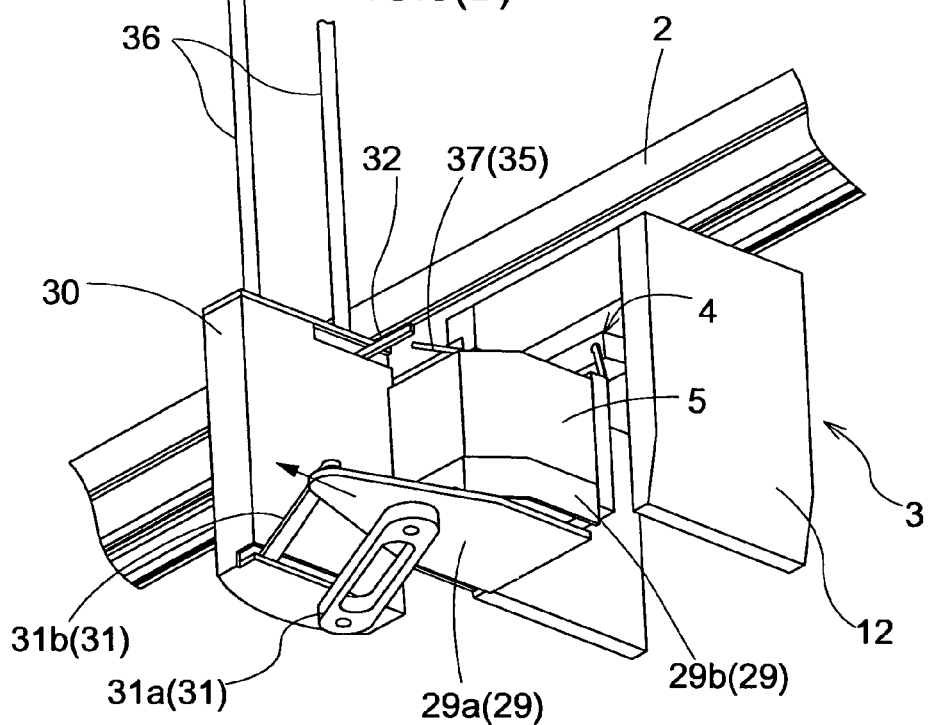
Figure 9A:
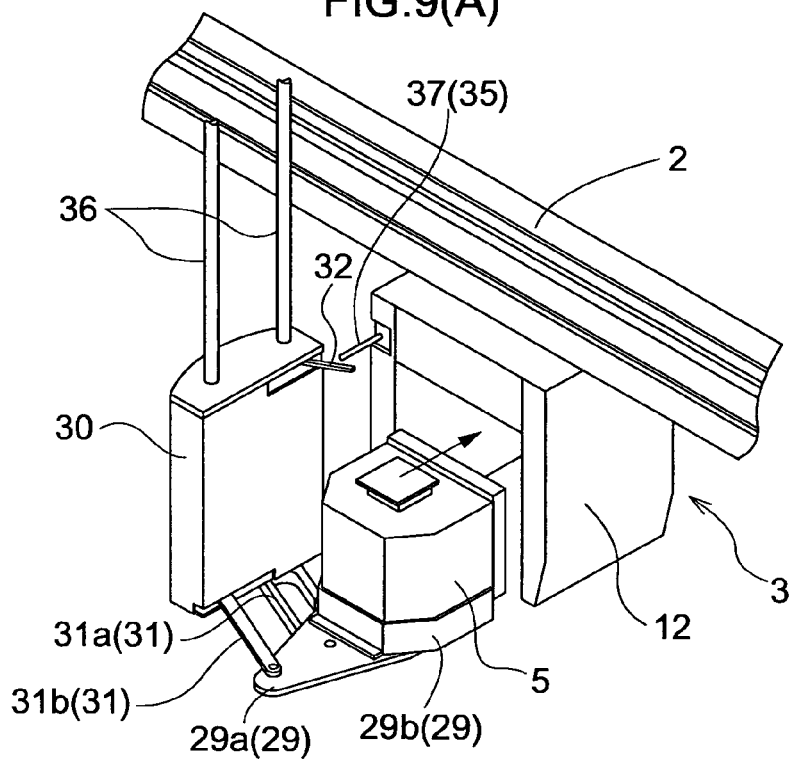
FIG. 9 is a perspective view showing the transport vehicle and article support.
Figure 9B:
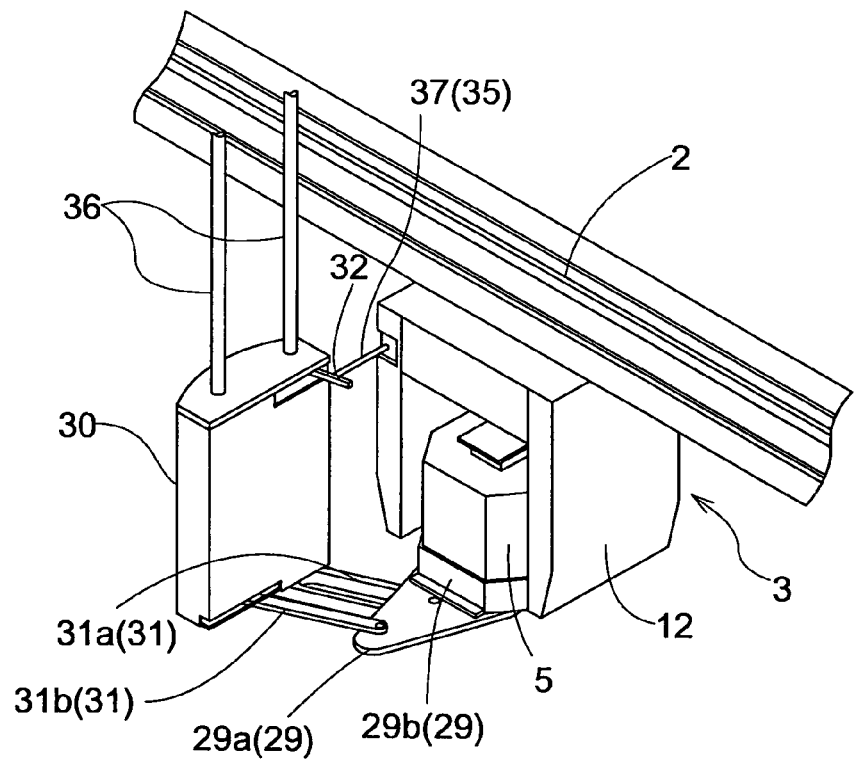

As shown in FIGS. 7 through 9, each of the article supports 29 is switchable between an article transfer position shown in FIG. 7 (B), FIG. 8 (A) and FIG. 9 (B) for receiving a container 5 from, and delivering a container 5 to, the gripper 4 of the transport vehicle 3 having stopped in the article transfer location corresponding thereto, and an article storage position shown in FIG. 7 (A), FIG. 8 (B) and FIG. 9 (A). The article support 29 in the article transfer position transfers a container 5 to or from the gripper 4 located adjacent the upper position.

The transport vehicle 3 has an operating means 35 for switching the article support 29 between the article storage position and article transfer position when the transport vehicle 3 stands still in the article transfer location.

The article transfer location is determined as corresponding to each of the article supports 29. The article support 29 is formed to have a width smaller than a distance between the pair of front and rear vertical frames 22. When the transport vehicle 3 stops in the article transfer location, the article support 29 is movable into and out of the space between the pair of front and rear vertical frames 22 of the transport vehicle 3.

The article storage position is at a side of the guide rail 2, and is set such that the article support 29, when in the article storage position, will not itself, or the container 5 placed thereof will not, obstruct movement of the transport vehicle 3 or vertical movement of the gripper 4.

The article transfer position is a position vertically overlapping the transport vehicle 3 standing still in the article transfer location. When the article support 29 is in the article transfer position, a container 5 can be transferred between the article support 29 and the gripper 4 located in the position adjacent the upper position.

A support means is provided for supporting the article support 29 to be switchable between the article storage position and article transfer position. This support means includes a link mechanism 31 pivotable about vertical axes relative to a fixed frame 30 installed as corresponding to the article storage position.

The fixed frame 30 is in the form of a vertically elongated box, and is fixed to the ceiling through a suspension support 36, so that its direction of thickness corresponds to the longitudinal direction of the guide rail 2. The fixed frame 30 is disposed only at one side of the article support 29 in the longitudinal direction of the guide rail 2. While the article supports 29 are arranged at both sides of the guide rail 2, the article supports 29 at one side and the article supports 29 at the other side have the fixed frames 30 in opposite positions relative to the article supports 29 in the longitudinal direction of the guide rail 2. That is, the fixed frames 30 of the article supports 29 at one side are arranged forwardly of the article supports 29 in the longitudinal direction of the guide rail 2, while the fixed frames 30 of the article supports 29 at the other side are arranged rearwardly of the article supports 29 in the longitudinal direction of the guide rail 2.

The link mechanism 31 is disposed at the lower end of the fixed frame 30 to extend horizontally from the fixed frame 30 and support the article support 29 in a cantilever mode. The link mechanism 31 includes two links, a first link 31a and a second link 31b, each having one end thereof pivotally connected to the fixed frame 30, and the other end pivotally connected to the article support 29.

The first link 31a has a plate-like shape broader than the second link 31b in plan view. The second link 31b is bar-shaped. The first link 31a and second link 31b are horizontally spaced apart, and the first link 31a is disposed closer than the second link 31b to the guide rail 2.

The first link 31a has one end connected to the fixed frame 30 from below, and the other end connected to the article support 29 from below to receive and support the article support 29 from below. The second link 31b has one end extending through a lower side opening 30a into an inner space to be connected to the fixed frame 30, and the other end connected to the article support 29 from above, to suspend and support the article support 29 from above.

The fixed frame 30 includes an operated element 32 supported to be movable toward and away from the transport vehicle 3 standing still in the article transfer location, and a resilient element 33 acting as a biasing means for biasing the article support 29 back to the article storage position.

The operated element 32 is linked to the link mechanism 31 such that the operated element 32, when in a proximate position close to the transport vehicle 3 standing still in the article transfer location, operates the article support 29 to the article storage position, and when in a remote position away from the transport vehicle 3, operates the article support 29 to the article transfer position.

The operating means 35 includes a pressing operating element 37 of the extension and retraction type. The operating element 37 is movable to project from the transport vehicle 3 (i.e. movable to a contact position) for pressing the operated element 32 from the proximate position (first position) to the remote position (second position), and movable to retract to the transport vehicle 3 for allowing the operated element 32 to return from the remote position to the proximate position. The pressing operating element 37 corresponds to the pressing type operating element of this invention.

The operated element 32 is mounted in an upper end region of the fixed frame 30 to be pivotable about a vertical axis relative to the fixed frame 30. The operated element 32 projects horizontally from the fixed frame 30, with a proximal end thereof extending through an upper side opening 30b into an inner space to be connected to the fixed frame 30.

The resilient element 33 is a coil spring, for example, with one end fixed to the fixed frame 30, and the other end fixed to the operated element 32, for biasing the operated element 32 back to the proximate position. A stopper 34 is provided for preventing the operated element 32 from rocking, under the biasing force of the resilient element 33, beyond the proximate position toward the transport vehicle 3.

The fixed frame 30 includes a linkage mechanism 38 for linking movement of the operated element 32 and movement of the link mechanism 31. This linkage mechanism 38 includes a large diameter gear 39 rotatable with the operated element 32, a small diameter gear 40 meshed with the large diameter gear 39, and a shaft 41 rotatable with the small diameter gear 40 and connected to the first link 31a.

To describe the above construction further, the operated element 32 usually is returned to the proximate position shown in FIG. 7 (A) by the biasing force of the resilient element 33 and restriction by the stopper 34. At this time, the linkage mechanism 38 causes the link mechanism 31 to hold the article support 29 in the article storage position.

When the operated element 32 rocks about the vertical axis, the large diameter gear 39 rotates with the rocking of the operated element 32. Then, the small diameter gear 40 rotates in an opposite direction to the large diameter gear 39. The shaft 41 rotates with the small diameter gear 40, rocking the first link 31a, and thus the link mechanism 31.

When the operated element 32 rocks from the proximate position (first position) shown in FIG. 7 (A) to the remote position (second position) shown in FIG. 7 (B) as described above, the rocking of the link mechanism 31 moves the article support 29 to the article transfer position.

The pressing operating element 37 is disposed in an upper position of the vertical frame 22, corresponding to the fixed frame 30, of the pair of front and rear vertical frames 22 of the transport vehicle 3 standing still in the article transfer location. The pressing operating element 37 includes a slider 37a horizontally slidable by operation of a known actuator such as an electric motor not shown, and a rod-like presser 37b attached to a forward end of the slider 37a for pressing the operated element 32. It should be noted that the pressing operating element 37 is provided for each of the pair of vertical frames 22. One of the pressing operating elements 37 corresponds to the fixed frames 30 of the article supports 29 arranged at one side of the guide rail 2. The other pressing operating element 37 corresponds to the fixed frames 30 of the article supports 29 arranged at the other side of the guide rail 2.

The pressing operating element 37 moves the presser 37b to project from the transport vehicle 3 by operating the actuator to slide the slider 37a. Thus, the presser 37b presses the operated element 32 from the proximate position shown in FIG. 7 (A) to the remote position shown in FIG. 7 (B). The pressing operating element 37 moves the presser 37b to retract to the transport vehicle 3 by operating the actuator to slide the slider 37a. This cancels the pressing action of the presser 37b applied to the operated element 32, whereby the biasing force of the resilient element 33 returns the operated element 32 from the remote position to the proximate position.

The motion occurring when switching the article support 29 between the article storage position and article transfer position will be described further.

The operated element 32 is located in the proximate position by the biasing force of the resilient element 33 and restriction by the stopper 34. When the operated element 32 is located in the proximate position, the linkage mechanism 38 causes the link mechanism 31 to support the article support 29 as located in the article storage position.

After the transport vehicle 3 stops at the article transfer location, the pressing operating element 37 moves the presser 37b to project from the transport vehicle 3 by operation of the actuator. The presser 37b presses and moves the operated element 32 from the proximate position to the remote position against the biasing force of the resilient element 33. Since the operated element 32 rocks about the vertical axis from the proximate position to the remote position at this time, the linkage mechanism 38 causes the link mechanism 31 to rock about of the vertical axes in the opposite direction to the operated element 32. In this way, the pressing operation of the pressing operating element 37 rocks the operated element 32 and link mechanism 31 together to switch the article support 29 from the article storage position to the article transfer position.

After the article support 29 is moved from the article storage position to the article transfer position, the pressing operating element 37 moves the presser 37b to retract to the transport vehicle 3 by operation of the actuator. When the pressure applied from the presser 37b to the operated element 32 is canceled, the biasing force of the resilient element 33 moves the operated element 32 from the remote position back to the proximate position. Since the operated element 32 rocks about the vertical axis from the remote position to the proximate position at this time, the linkage mechanism 38 causes the link mechanism 31 to rock in the opposite direction to the operated element 32. In this way, the biasing force of the resilient element 33 rocks the operated element 32 and link mechanism 31 together to switch the article support 29 from the article transfer position to the article storage position.

Since the operated element 32 is disposed in the upper end region of the fixed frame 30, the pressing operating element 37 can press the operated element 32 properly without interference of other components. The pressing operating element 37 may be disposed in a position on the transport vehicle 3 not to interfere with other components of the transport vehicle 3.

The operated element 32 is disposed in the upper end region of the fixed frame 30, and the link mechanism 31 disposed at the lower end of the fixed frame 30. Thus, the construction for rockably attaching the operated element 32 and link mechanism 31 to the fixed frame 30 may be simplified while efficiently using the space between the operated element 32 and link mechanism 31 as space for receiving a container 5.

The transport vehicle 3 includes a carriage controller for controlling operation of the transport vehicle 3. The carriage controller controls movement of the transport vehicle 3, vertical movement of the gripper 4, and operation of the gripping motor 27 and the actuator of the pressing operating element 37, based on commands from a supervising computer that controls operation of the entire article transport facility, and on detection information from various sensors provided on the transport vehicle 3.

When, for example, the supervising computer gives a transport command indicating a transport starting station 7 and a destination station 7 among the plurality of stations 7, the carriage controller controls operation of the transport vehicle 3 to pick up a container 5 from the transport starting station 7, and then deliver the container 5 to the destination station 7.

When picking up the container 5 from the transport starting station 7, the carriage controller first controls movement of the transport vehicle 3 to stop the transport vehicle 3 in a stopping position corresponding to the transport starting station 7. Next, with the transport vehicle 3 standing still in the stopping position corresponding to the transport starting station 7, the carriage controller performs lift control of the gripper 4 to lower the gripper 4 from the upper position to the lower position. When the gripper 4 is located in the lower position, the carriage controller operates the gripping motor 27 to switch the pair of gripping elements 4a to the gripping position, whereby the gripping elements 4a grip the flange 5a of the container 5. Subsequently, the carriage controller performs lift control of the gripper 4 to raise the gripper 4 from the lower position to the upper position. When the gripper 4 is located in the upper position, the carriage controller controls movement of the transport vehicle 3 to stop the transport vehicle 3 in a stopping position corresponding to the destination station 7.

When the transport vehicle 3 has stopped in the stopping position corresponding to the destination station 7, the carriage controller delivers the container to the destination station 7 by lift control of the gripper 4 and operation of the gripping motor 27, as performed when picking up the container 5 from the transport starting station 7.

When the supervising computer gives a storage command for storing a container 5 on one of the plurality of article supports 29, the carriage controller first controls movement of the transport vehicle 3 to stop the transport vehicle 3 at an article transfer location corresponding to the article support 29 for transfer. Next, with the transport vehicle 3 standing still in the article transfer location corresponding to the article support 29 for transfer, the carriage controller operates the actuator of the pressing operating element 37 to press with the presser 37b and move the operated element 32 from the proximate position to the remote position, thereby switching the article support 29 from the article storage position to the article transfer position, as shown in FIG. 8 (A). After performing lift control of the gripper 4 to lower the gripper 4 from the upper position to the lower position, the carriage controller operates the gripping motor 27 to switch the pair of gripping elements 4a to the release position, thereby delivering the container 5 from the gripper 4 to the article support 29 located in the article transfer position. Then, after performing lift control of the gripper 4 to raise the gripper 4 to the upper position, the carriage controller operates the actuator of the pressing operating element 37 to cancel the pressing action of the presser 37b applied to the operated element 32, thereby switching the article support 29 from the article transfer position to the article storage position, as shown in FIG. 8 (B).

When the supervising computer gives a fetch command for fetching a container 5 from one of the plurality of article supports 29, the carriage controller controls movement of the transport vehicle 3 and operation of the actuator of the pressing operating element 37 as in the case of the storage command, and switches the article support 29 from the article storage position to the article transfer position, as shown in FIG. 9 (A) (B). After performing lift control of the gripper 4 to lower the gripper 4 from the upper position to the lower position, the carriage controller operates the gripping motor 27 to switch the pair of gripping elements 4a to the gripping position for receiving the container 5 from the article support 29. Then, after performing lift control of the gripper 4 to raise the gripper 4 to the upper position, the carriage controller operates the actuator of the pressing operating element 37 to switch the article support 29 from the article transfer position to the article storage position.

Second Embodiment

Next, an article transport facility in the second embodiment will be described. The second embodiment shows a modification of the support means in the first embodiment described above.

The construction of the support means in the second embodiment will be described hereinafter with reference to FIGS. 10 through 14. The other aspects of the construction are the same as in the first embodiment, and will not be described again.

Figure 11:
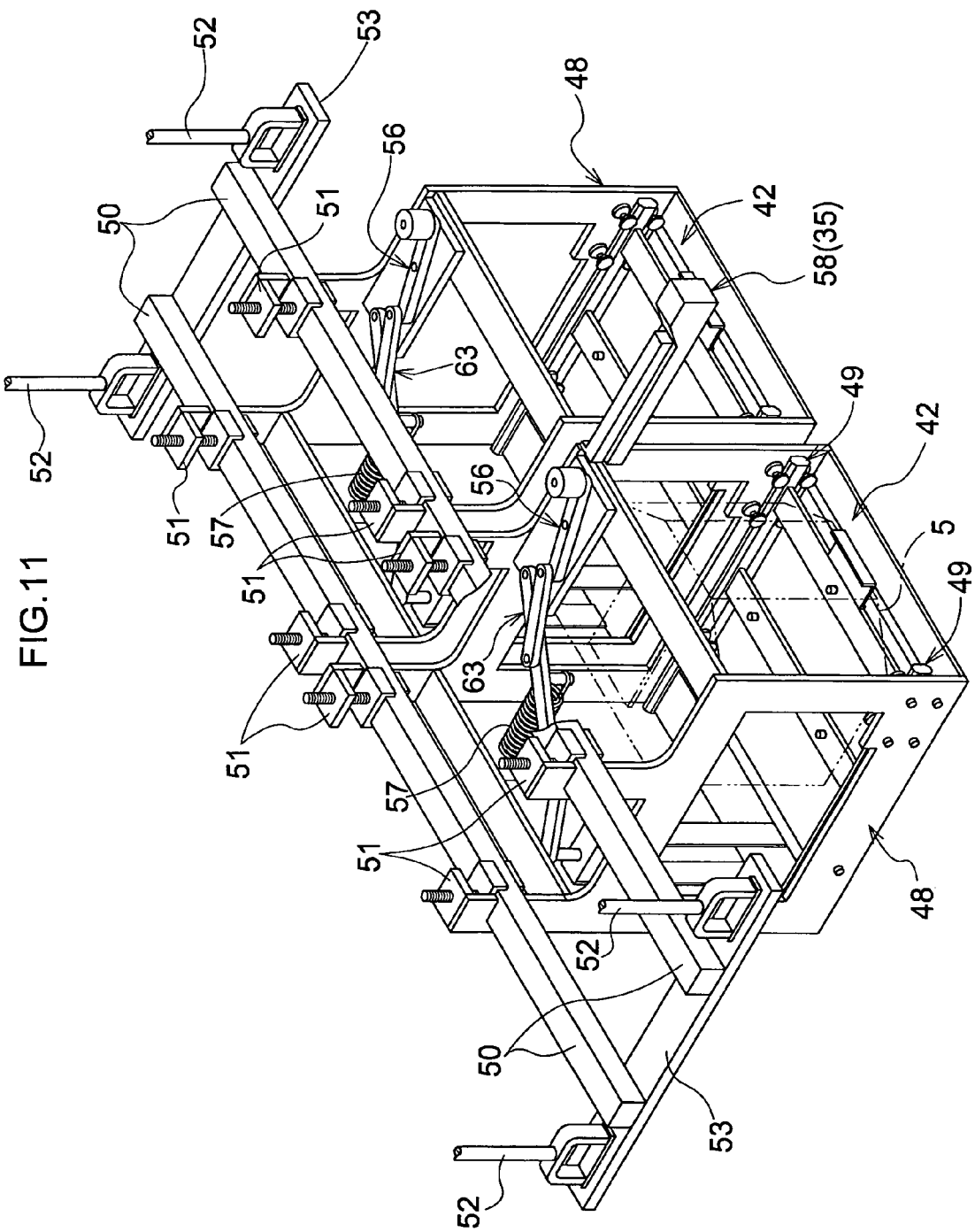
FIG. 11 is a perspective view of the article support and fixed frame.
Figure 12:
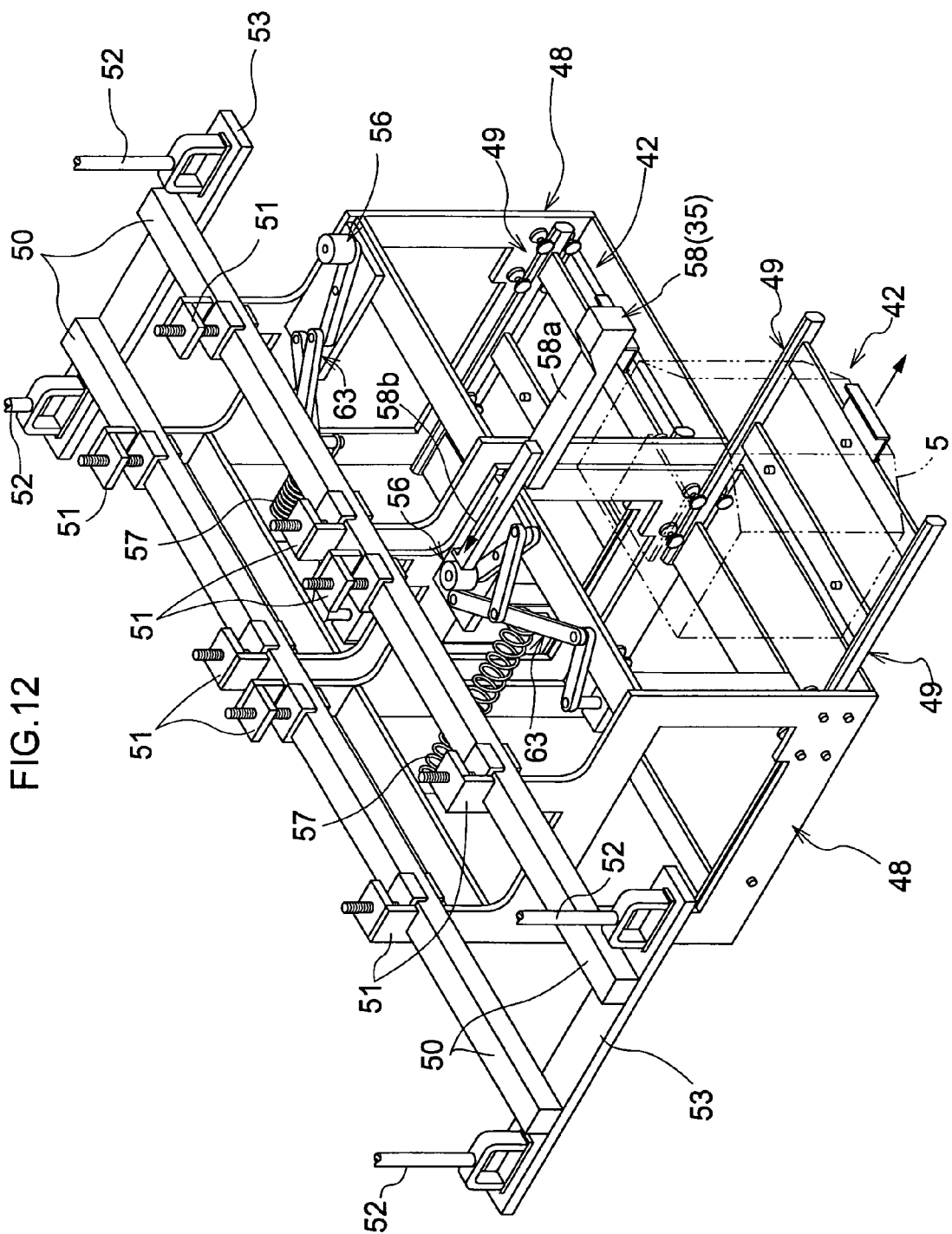
FIG. 12 is a perspective view of the article support and fixed frame.
Figure 13A:
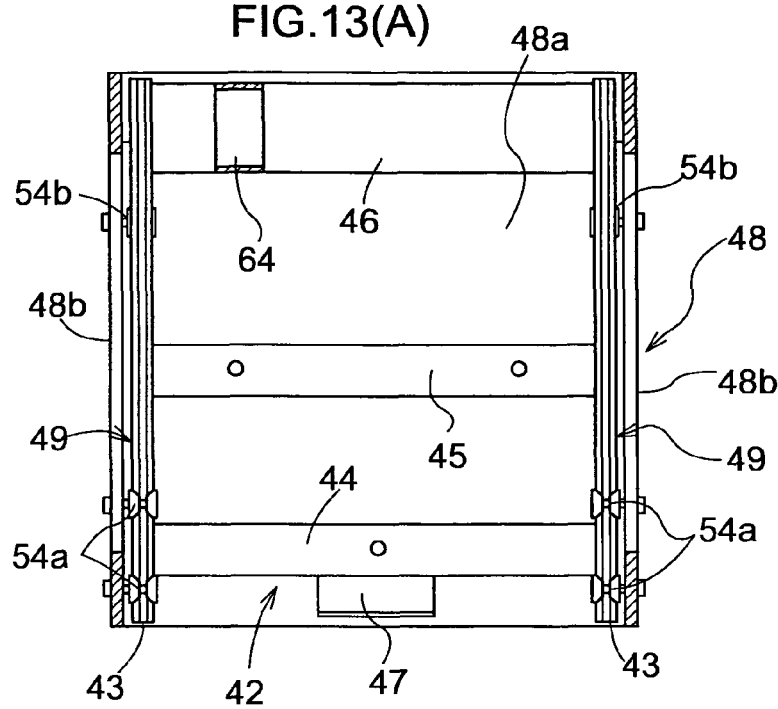
FIG. 13 is a plan view of the fixed frame and the fixed frame.
Figure 13B:
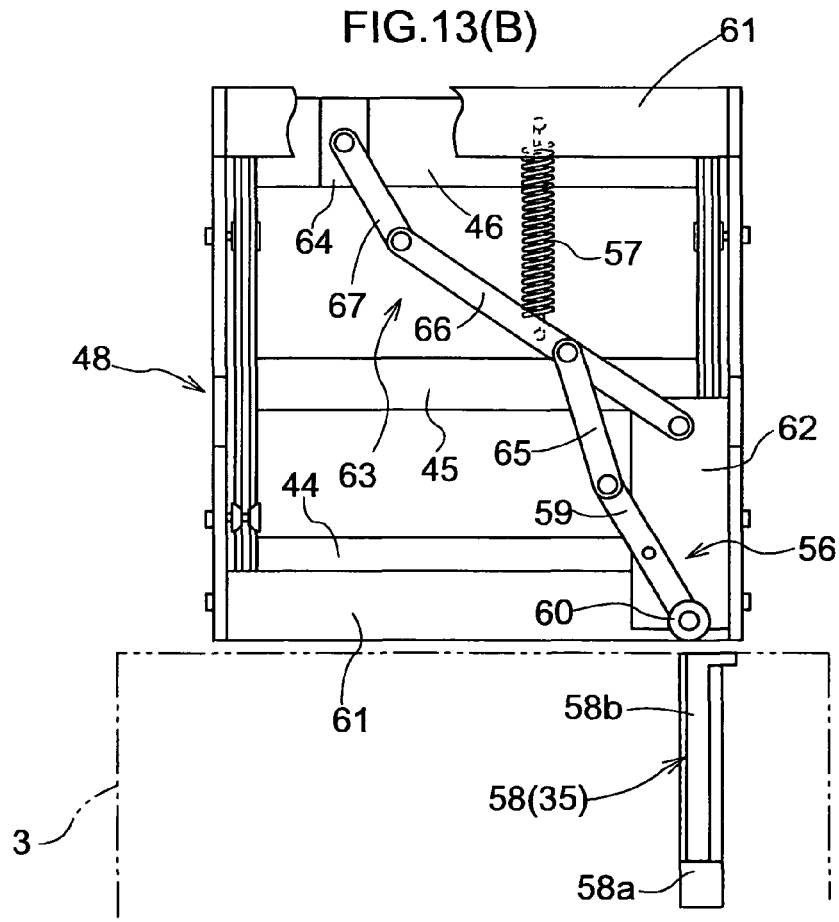

FIG. 10 is a perspective view showing an overall construction of one article support 42. FIGS. 11 and 12 are perspective views of two article supports 42 arranged side by side, FIG. 11 shows both the article supports 42 located in an article storage position. FIG. 12 shows one of the article supports switched to an article transfer position. FIG. 13 (A) shows a plan view of an upper portion of the article support 42 located in the article storage position. FIG. 13 (B) shows a plan view of a lower portion of the article support 42 located in the article storage position. FIG. 14 (A) shows a plan view of the upper portion of the article support 42 located in the article transfer position. FIG. 14 (B) shows a plan view of the lower portion of the article support 42 located in the article transfer position.

The support means for supporting the article support 42 to be movable between the article storage position and article transfer position is in the form of a slide guide mechanism 49 supporting the article support 42 to be slidable relative to a fixed frame 48 installed as corresponding to the article storage position, toward and away from the transport vehicle 3 standing still in the article transfer location.

As shown in FIG. 10, the article support 42 has a pair of bar-like frame members 43 extending toward and away from the transport vehicle 3 standing still in the article transfer location, and interconnected by three plate-like members 44-46. The plate-like members 44-46 are arranged at intervals in the direction toward and away from the transport vehicle 3 standing still in the article transfer location. These are a first plate-like member 44, a second plate-like member 45 and a third plate-like member 46 arranged in order from adjacent the transport vehicle 3 in the article transfer location. The first and second plate-like members 44 and 45 serve as support members for supporting a container 5. The first and second plate-like members 44 and 45 support the container 5 as positioned by positioning pins W arranged thereon. The first plate-like member 44 has a restrictor 47 for contacting a side of the container 5 and restricting movement thereof toward the transport vehicle 3 standing still in the article transfer location. The third plate-like member 46 is formed broader than the first and second plate-like members 44 and 45, to connect ends of the frame members 43 remote from the transport vehicle 3 in the article transfer location.

The fixed frame 48 is U-shaped with a bottom frame portion 48a and a pair of side frame portions 48b extending upward from the bottom frame portion 48a, and is arranged to cover areas below and laterally of the article support 42

The fixed frame 48 is supported in suspension, with attachment parts 51 formed at ends of upward extensions of the respective side frame portions 48b, and fixed to two frame supports 50 by metal fittings. As shown in FIGS. 11 and 12, the frame supports 50 are arranged to extend along the guide rail 2 as placed and supported on suspension supports 53. The suspension supports 53 are supported as suspended from the ceiling by suspender bolts 52. In this way, the fixed frames 48 are supported as suspended from the ceiling. Each fixed frame 48 may be installed or removed by attaching or detaching the attachment parts 51 to/from the frame supports 50. Therefore, when increasing or decreasing the number of article supports 42, each of the fixed frames 48 may be installed or removed. This facilitates an operation to increase or decrease the number of article supports 42.

The slide guide mechanism 49 includes a plurality of guide rollers 54 arranged on each of the side frame portions 48b of the fixed frame 48, and rails 55 supported and guided by the guide rollers 54.

The rails 55 are formed on each of the pair of frame members 43 of the article support 42, and formed on both of an upper surface and a lower surface of each frame member 43. The guide rollers 54 include two pairs of upper and lower guide rollers 54a and 54b arranged in an end region of each side frame portion 48b close to the transport vehicle 3, the upper guide rollers 54a supporting and guiding the upper rail 55a on the upper surface of the frame member 43, the lower guide rollers 54b supporting and guiding the lower rail 55b on the lower surface of the frame member 43, and one lower guide roller 54b disposed in an end region of each side frame portion 48b remote from the transport vehicle 3 for supporting and guiding the lower rail 55b on the lower surface of the frame member 43.

The fixed frame 48 includes an operated element 56 supported to be movable toward and away from the transport vehicle 3 standing still in the article transfer location, and a resilient element 57 acting as a biasing means for biasing the article support 42 back to the article storage position.

The operated element 56 is linked with the slide guide mechanism 49 such that the operated element 56, when in a proximate position close to the transport vehicle 3 standing still in the article transfer location, operates the article support 42 to the article transfer position as shown in FIG. 13, and when in a remote position away from the transport vehicle 3, operates the article support 42 to the article storage position as shown in FIG. 14.

The operated element 56 is disposed above the fixed frame 48, and includes a rocking element 59 pivotable about a vertical axis relative to the fixed frame 48, and a roller 60 rotatable about a vertical axis disposed at one end of the rocking element 59. The rocking element 59 is pivotally connected in a middle position thereof to a support 62 provided on an upper end position of the fixed frame 48, to be pivotable about a vertical axis relative to the support 62. The support 62 pivotally connecting the rocking element 59 is mounted on a coupling member 61 closer to the transport vehicle 3 standing still in the article transfer location, of plate-like coupling members 61 interconnecting top ends of the pair of side frame portions 48b. The support 62 is disposed in a position adjacent an inner side of one of the side frame portions 48b of the fixed frame 48, and has a longitudinal direction thereof coinciding with the direction toward and away from the transport vehicle 3 standing still in the article transfer location.

The operated element 56 is fitted within the width, in the longitudinal direction of the guide rail 2, of the article support 42 located in the article storage position. Therefore, as installation space of article supports 42 longitudinally of the guide rail 2, it is necessary only to secure a space for installing a pair of fixed frames 48 slightly larger than the width of container 5. Thus, the installation space of article supports 42 may be reduced in the longitudinal direction of the guide rail 2. Since a plurality of article supports 42 can be arranged in a reduced space in the longitudinal direction of the guide rail 2, a plurality of containers 5 can be stored while saving space.

The fixed frame 48 includes a linkage mechanism 63 for linking movement of the operated element 56 and movement of the article support 42 such that, when the operated element 56 is located in the proximate position, the article support 42 is located in the article storage position, and when the operated element 56 is located in the remote position, the article support 42 is located in the article transfer position. The linkage mechanism 63 includes three link arms, i.e. a first link arm 65, a second link arm 66 and a third link arm 67, pivotable about vertical axes for linking movement of the rocking element 59 of the operated element 56 and movement of a linking operated element 64 erected on the third plate-like member 46 of the article support 42.

The first link arm 65 has one end thereof pivotally connected to one end of the rocking element 59 of the operated element 56, and the other end pivotally connected to a longitudinally intermediate position of the second link arm 66. The second link arm 66 has one end thereof pivotally connected to the support 62, and the other end pivotally connected to one end of the third link arm 67. The third link arm 67 has the other end pivotally connected to the linking operated element 64.

The resilient element 57 is a coil spring, for example, with one end fixed to the coupling frame 61 remote from the transport vehicle 3 standing still in the article transfer location, and the other end fixed to the second link arm 66. The resilient element 57 biases the second link arm 66 away from the transport vehicle 3 in the article transfer location, to bias the operated element 56 to the proximate position, thereby to bias the article support 42 back to the article storage position.

The transport vehicle 3 includes an operating means 35 having a pressing operating element 58 of the pressing type. The operating element 58 is movable to project from the transport vehicle 3 for pressing the operated element 56 from the proximate position to the remote position, and movable to retract to the transport vehicle 3 for allowing the biasing force of the resilient element 57 to return the operated element 56 from the remote position to the proximate position.

Figure 15:
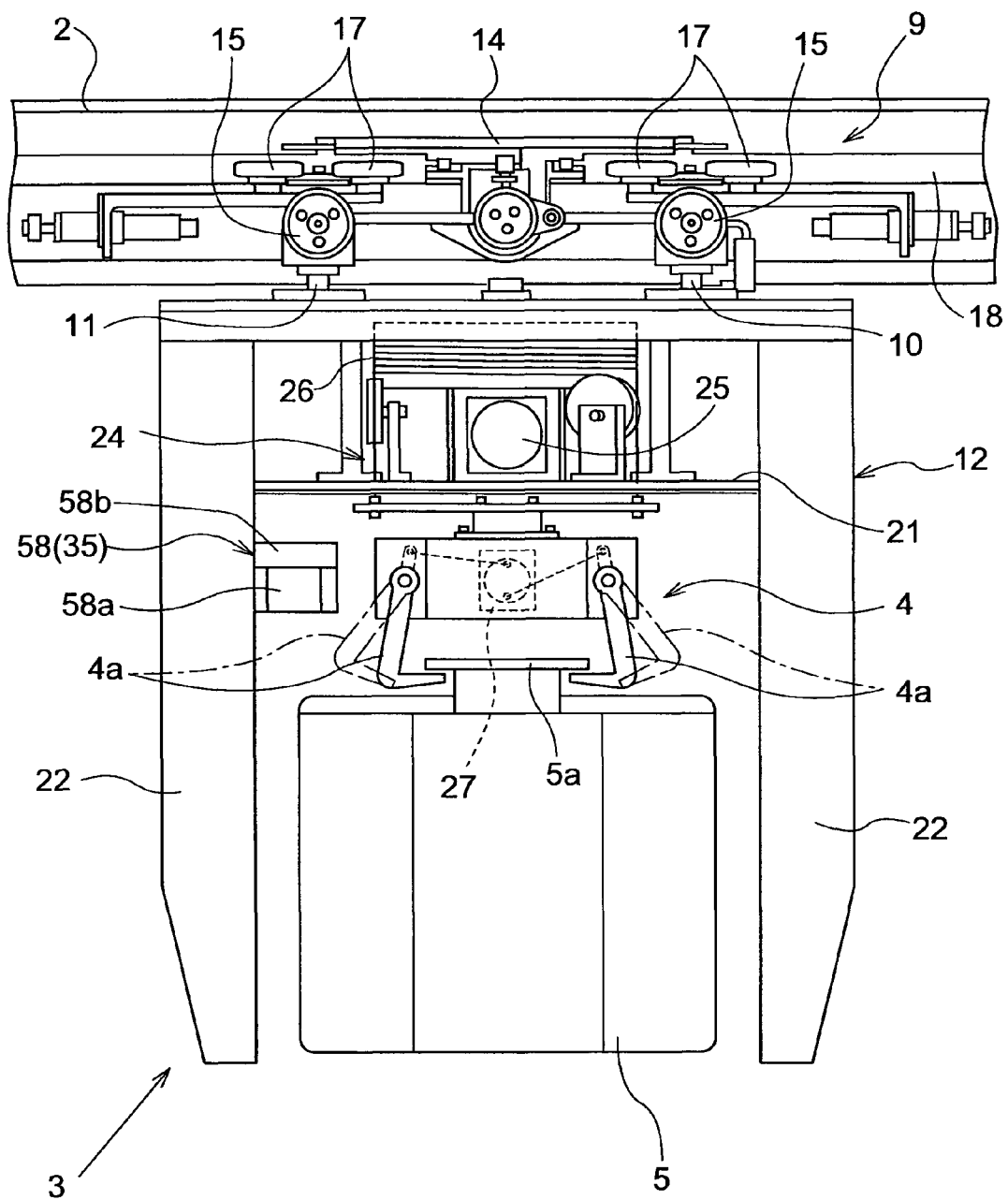
FIG. 15 is a side view of the transport vehicle.

As shown in FIG. 15, the pressing operating element 58 is disposed between the pair of front and rear vertical frames 22, at a side of the gripper 4, and within the fore and aft width of the transport vehicle 3. Thus, the pressing operating element 58 is fitted in the fore and aft width of the transport vehicle 3, while the operated element 56 of the fixed frame 48 is fitted in the width, in the longitudinal direction of the guide rail 2, of the article support 42 located in the article storage position. This allows a plurality of article supports 42 to be installed longitudinally of the guide rail 2 while minimizing spacing between the article supports 42. A plurality of article supports 42 can be installed efficiently in a small space.

The pressing operating element 58 includes a slider 58b slidable relative to a base 58a by operation of an actuator such as an electric motor not shown. The pressing operating element 37 moves the slider 58b to project from the transport vehicle 3 by operating the actuator. Thus, the slider 58b presses the operated element 56 from the proximate position shown in FIG. 13 (B) to the remote position shown in FIG. 14 (B). The pressing operating element 58 moves the slider 58b to retract to the transport vehicle 3 by operating the actuator. This cancels the pressing action of the slider 58b applied to the operated element 56, whereby the biasing force of the resilient element 57 returns the operated element 56 from the remote position to the proximate position The motion occurring when switching the article support 42 between the article storage position and article transfer position will be described further.

As shown in FIGS. 11 and 13, the operated element 56 is located in the proximate position by the biasing force of the resilient element 57. When the operated element 56 is located in the proximity position, the linkage mechanism 63 causes the slide guide mechanism 49 to support the article support 42 as located in the article storage position.

After the transport vehicle 3 stops at the article transfer location, the pressing operating element 58 moves the slider 58b to project from the transport vehicle 3 by operation of the actuator. The slider 58b presses and moves the operated element 56 from the proximate position to the remote position against the biasing force of the resilient element 57. The movement of the operated element 56 from the proximate position to the remote position rocks the first to third link arms 65-67 about the vertical axes, thereby operating the linking operated element 64 toward the transport vehicle 3 standing still in the article transfer location. At this time, the rails 55 on the frame members 43 of the article support 42 are guided by the guide rollers 54 and, as shown in FIGS. 12 and 14, the article support 42 slides from the article storage position to the article transfer position.

After the article support 42 is moved from the article storage position to the article transfer position, the pressing operating element 58 moves the slider 58b to slide and retract to the transport vehicle 3 by operation of the actuator. When the pressure applied from the slider 58b to the operated element 56 is canceled, the biasing force of the resilient element 57 moves the operated element 56 from the remote position back to the proximate position. The movement of the operated element 56 from the remote position to the proximate position rocks the first to third link arms 65-67 about the vertical axes, thereby operating the linking operated element 64 away from the transport vehicle 3 standing still in the article transfer location. At this time, the rails 55 on the frame members 43 of the article support 42 are guided by the guide rollers 54, and the article support 42 slides from the article transfer position to the article storage position.

When storing a container 5 on the article support 42, the supervising computer gives a storage command to the carriage controller for storing the container 5 on the article support 42, indicating the article support 42 as a destination among a plurality of article supports 42.

The carriage controller first controls movement of the transport vehicle 3 to stop the transport vehicle 3 at the article transfer location corresponding to the destination article support 42. Next, with the transport vehicle 3 standing still in the article transfer location corresponding to the article support 42, the carriage controller operates the actuator of the pressing operating element 58 to press with the slider 58b and move the operated element 56 from the proximate position to the remote position, thereby moving the article support 42 from the article storage position to the article transfer position, as shown in FIGS. 12 and 14. After performing lift control of the gripper 4 to lower the gripper 4 from the upper position to the lower position, the carriage controller operates the gripping motor 27 to switch the pair of gripping elements 4a to the release position, thereby delivering the container 5 from the gripper 4 to the article support 42 located in the article transfer position. Then, after performing lift control of the gripper 4 to raise the gripper 4 to the upper position, the carriage controller operates the actuator of the pressing operating element 58 to cancel the pressing action of the slider 58b applied to the operated element 56, thereby moving the article support 42 from the article transfer position to the article storage position, as shown in FIGS. 11 and 13.

When fetching the container 5 stored on the article support 42, the supervising computer gives a fetch command to the carriage controller for fetching the container 5 from the article support 42, indicating the article support 42 for transfer among the plurality of article supports 42.

The carriage controller controls movement of the transport vehicle 3 and operation of the actuator of the pressing operating element 58 as in the case of the storage command, and moves the article support 42 from the article storage position to the article transfer position. After performing lift control of the gripper 4 to lower the gripper 4 from the upper position to the lower position, the carriage controller operates the gripping motor 27 to switch the pair of gripping elements 4a to the gripping position for receiving the container 5 from the article support 42. Then, after performing lift control of the gripper 4 to raise the gripper 4 to the upper position, the carriage controller operates the actuator of the pressing operating element 56 to move the article support 42 from the article transfer position to the article storage position.

Third Embodiment

Next, an article transport facility in the third embodiment will be described. The third embodiment shows modifications of the fixed frame and slide guide mechanism in the second embodiment described above.

The constructions of fixed frame 74 and slide guide mechanism 70 in the third embodiment will be described hereinafter with reference to FIGS. 16 through 21. The other aspects of the construction will not be described again.

Figure 16:
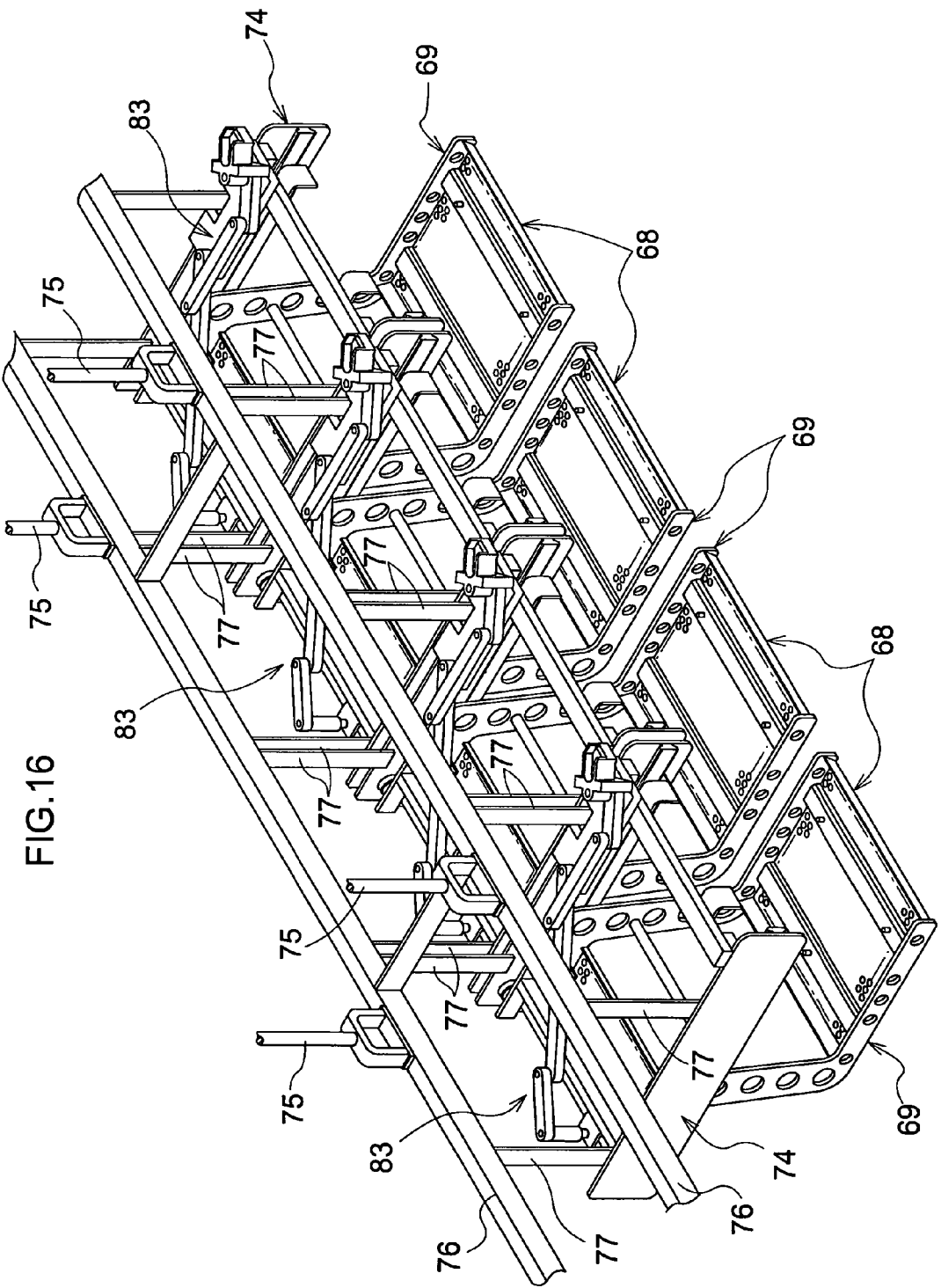
FIG. 16 is a perspective view of article supports and fixed frames.
Figure 17:
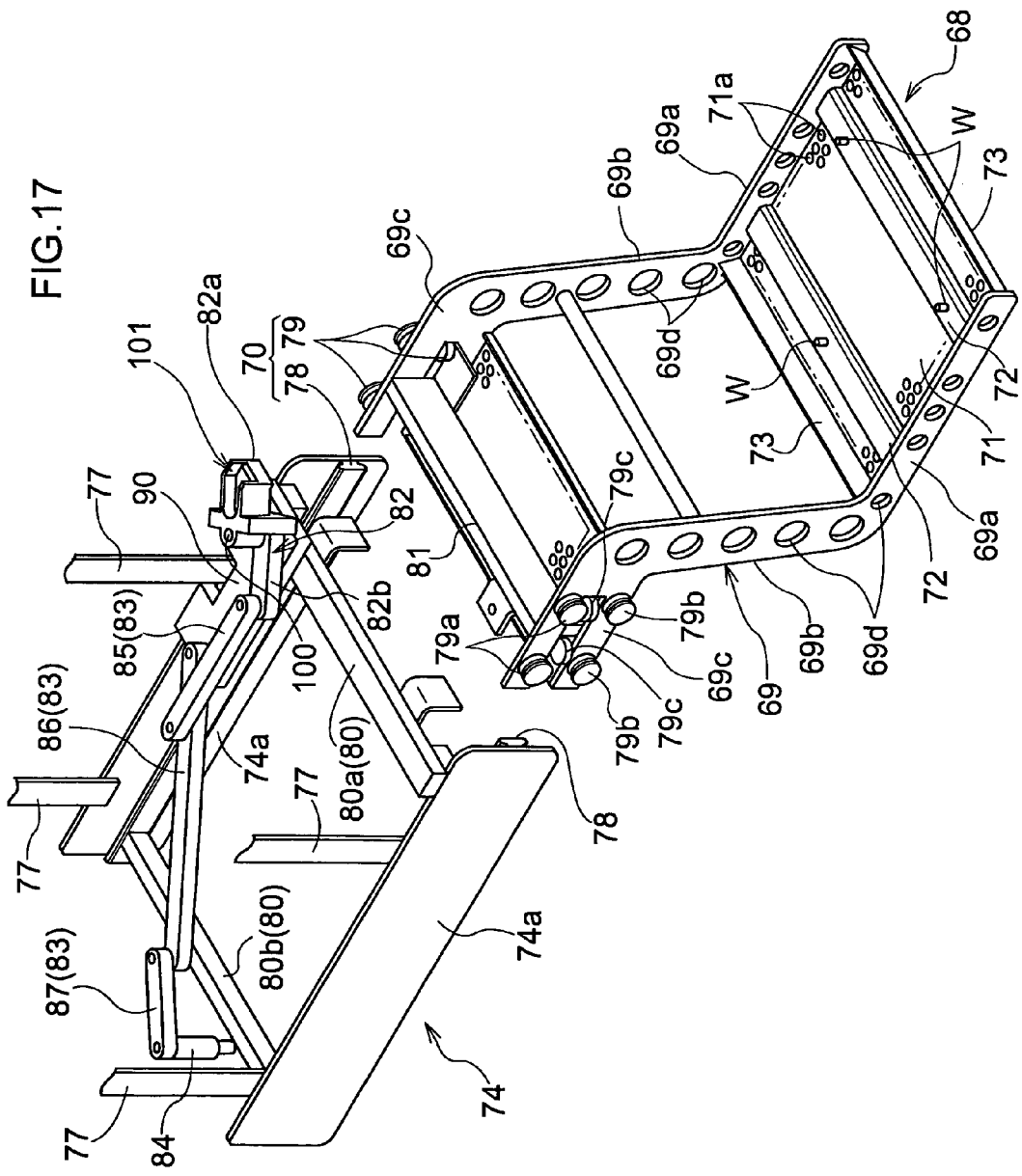
FIG. 17 is an exploded perspective view of an article support and a fixed frame.
Figure 18:
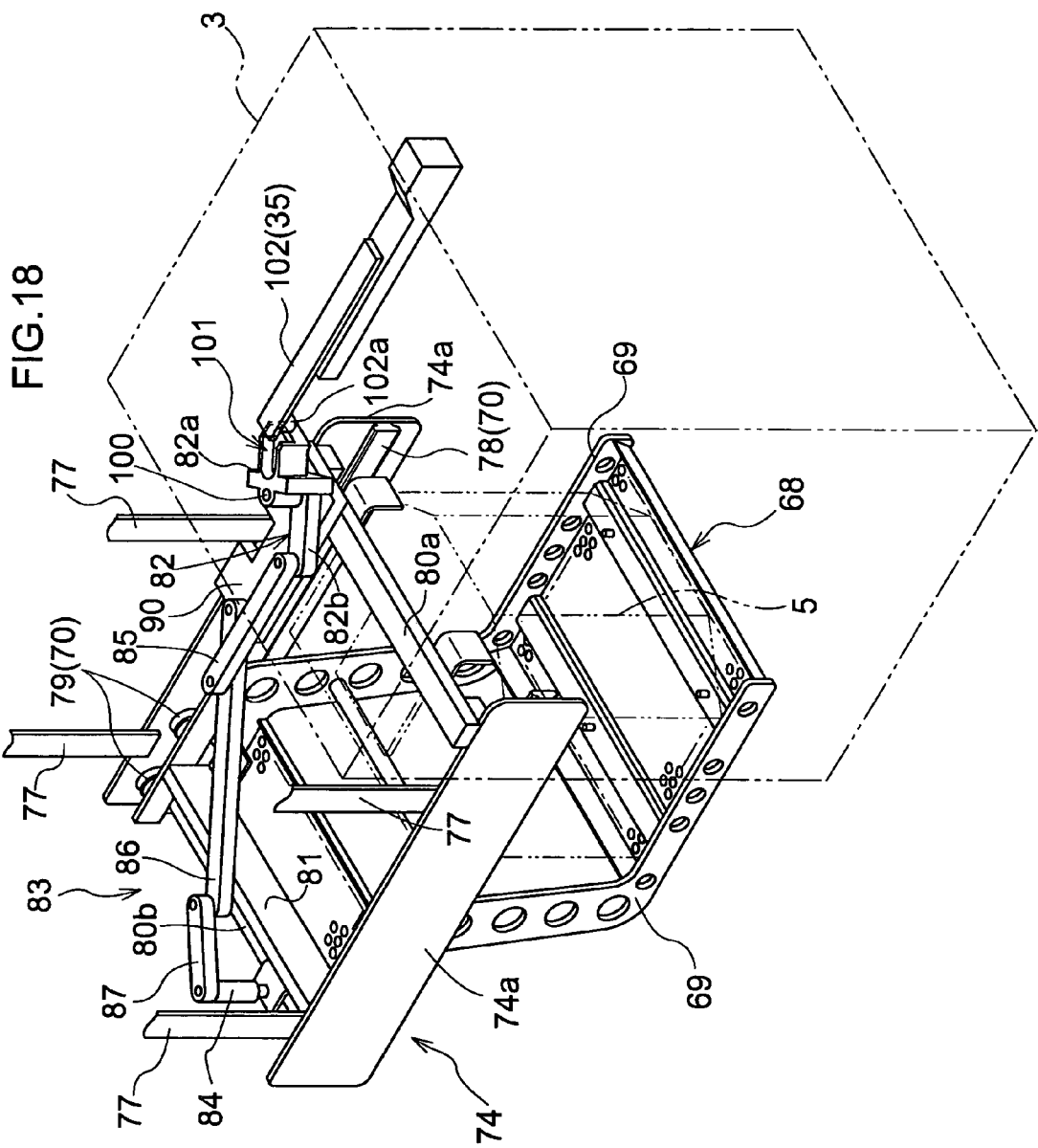
FIG. 18 is a perspective view of the article support and fixed frame.
Figure 19:
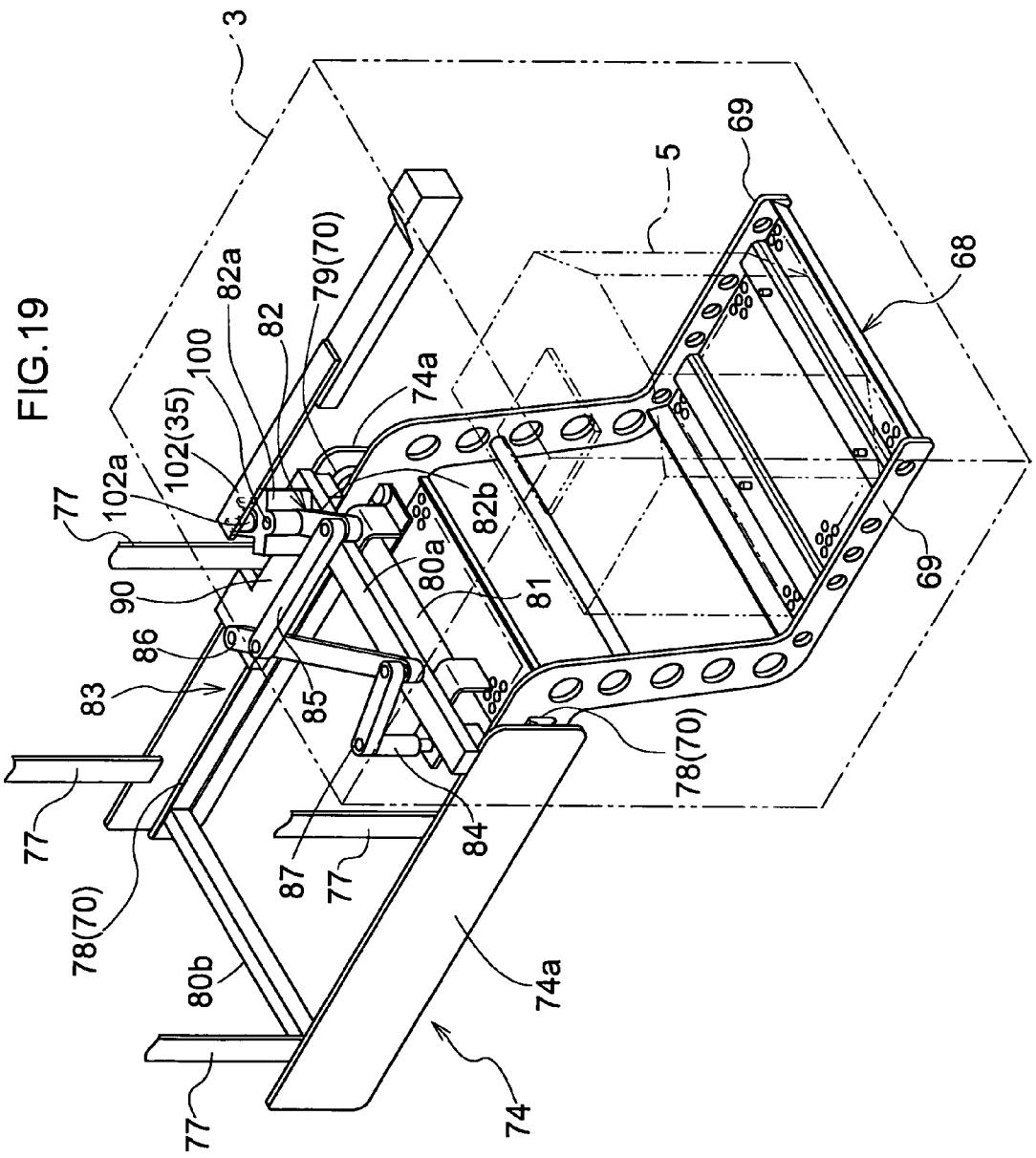
FIG. 19 is a perspective view of the article support and fixed frame.
Figure 20:
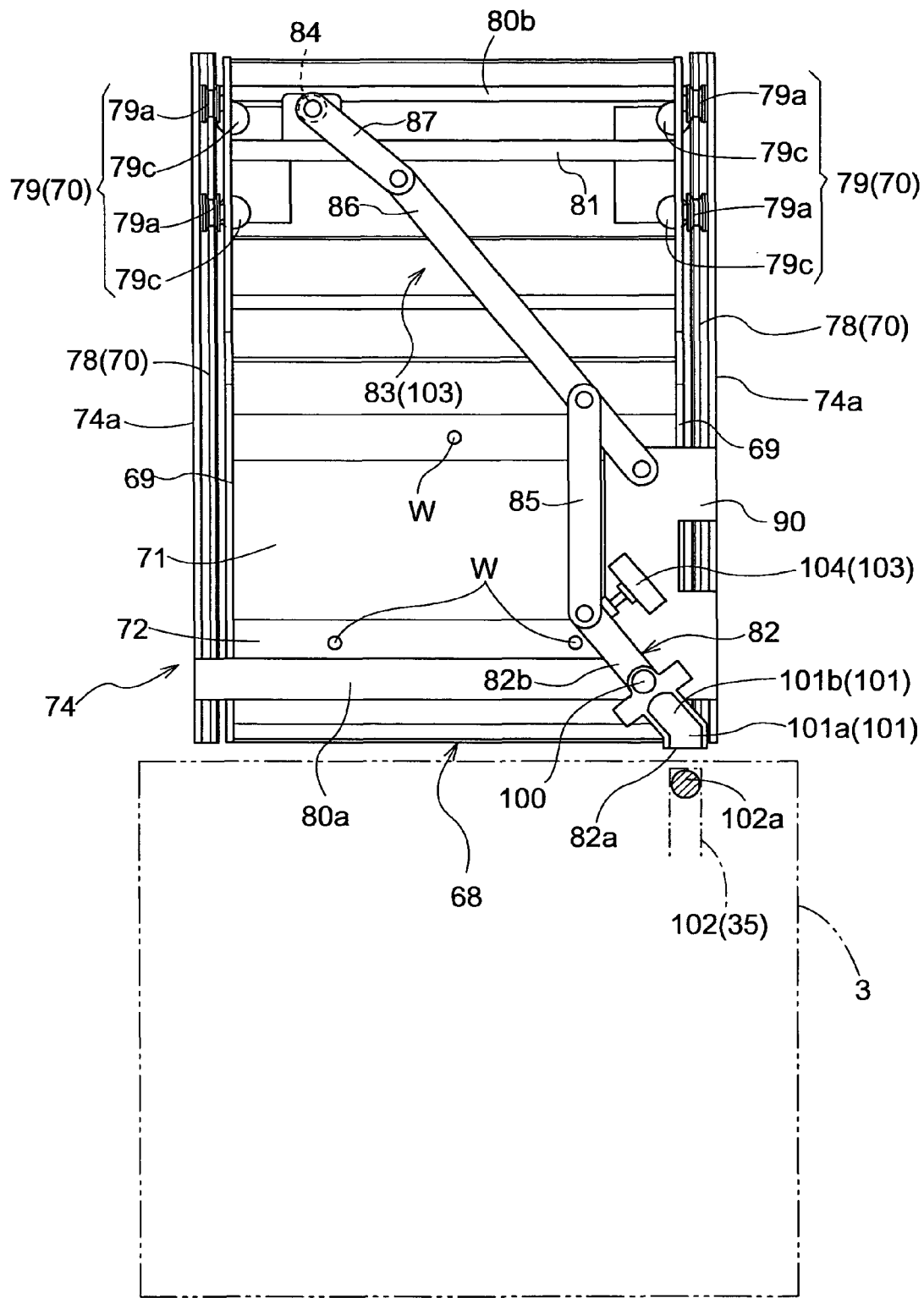
FIG. 20 is a plan view of the article support and fixed frame.
Figure 21:
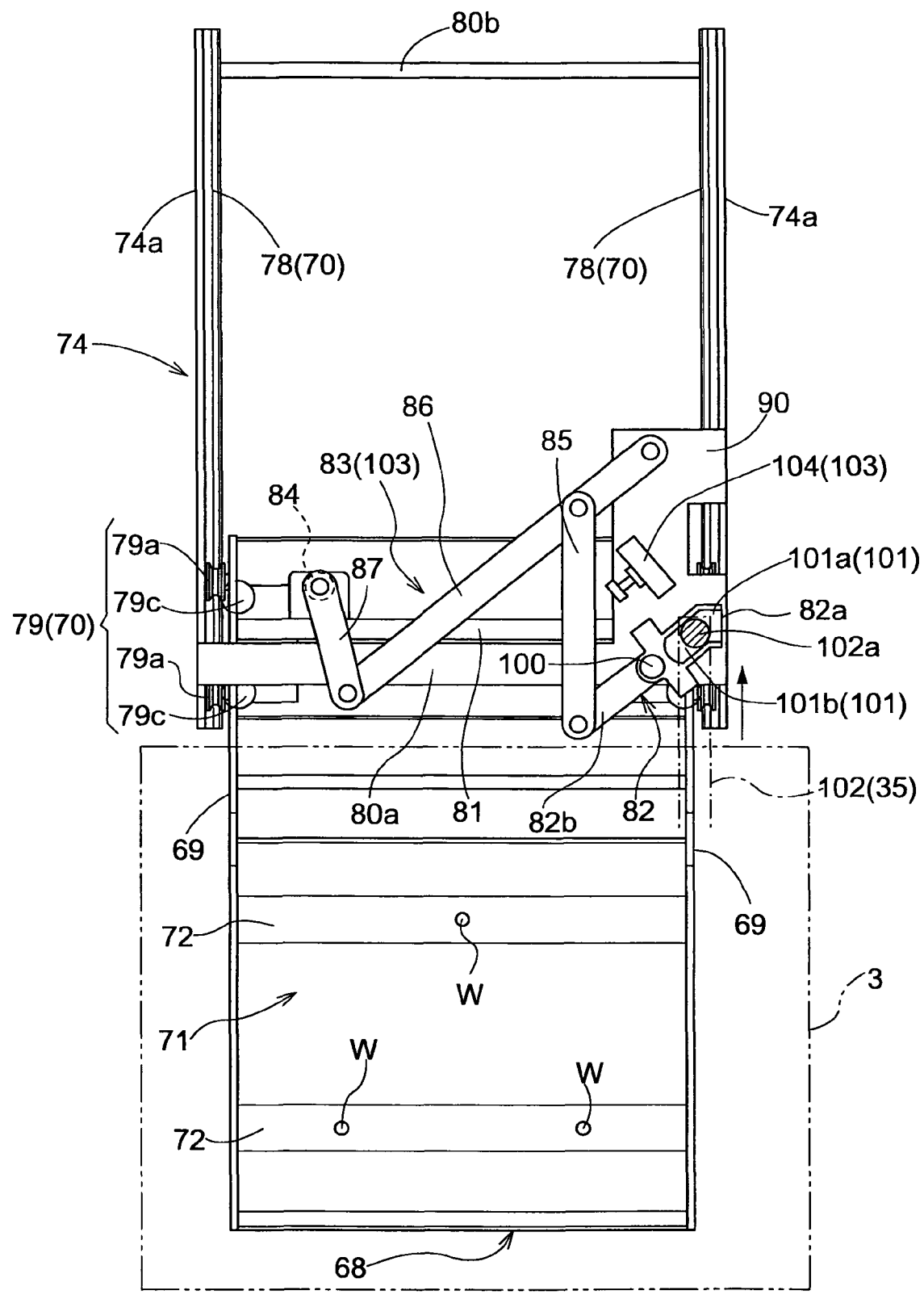
FIG. 21 is a plan view of the article support and fixed frame.

FIG. 16 is a perspective view showing four article supports 68 arranged side by side. FIG. 17 shows an exploded perspective view of an article support detached from the fixed frame 74. FIG. 18 shows a perspective view of an article support 68 located in an article storage position. FIG. 19 shows the article support 68 switched to an article transfer position. FIG. 20 shows a plan view of the article support 68 located in the article storage position. FIG. 21 shows a plan view of the article support 68 switched to the article transfer position.

As shown in FIG. 17, the article support 68 has suspension supports 69 extending upward from the article support 68. The slide guide mechanism 70 supports upper ends 69c of the suspension supports 69 to be slidable relative to the fixed frame 74 installed as corresponding to the article storage position, toward and away from the transport vehicle 3 standing still in the article transfer location.

The article support 68 includes a plat-like bottom member 71 with a pair of front and rear holding members 72 arranged thereon for supporting a container 5. The front and rear holding members 72 have positioning pins W for positioning the container 5 supported on the holding members 72. The bottom member 71 has restrictors 73 arranged at opposite ends thereof for contacting sides of the container 5 and restricting movement thereof toward and away from the transport vehicle 3 in the article transfer location. The bottom member 71 has a plurality of bores 71a arranged in a plurality of rows.

The suspension supports 69 are arranged at right and left sides of the article support 68. Each of the suspension supports 69 includes a lower end portion 69a connected to a side face of the article support 68 and extending toward and away from the transport vehicle 3 standing still in the article transfer location, an intermediate portion 69b extending vertically from an end in the longitudinal direction of the lower end portion 69a, and an upper end portion 69c extending from an end of the intermediate portion 69b toward and away from the transport vehicle 3 in the article transfer location. The upper ends portions 69 of the suspension supports 69 are interconnected by a suspension coupling member 81. The lower end portion 69a and intermediate portion 69b define a plurality of bores 69d arranged at intervals in the longitudinal direction thereof. The fixed frame 74 includes a pair of side frame portions 74a arranged outside the article support 68, and is elongated in the direction toward and away from the transport vehicle 3 standing still in the article transfer location. The pair of side frame portions 74a are interconnected by frame coupling members 80. A first frame coupling member 80a is disposed closer to the transport vehicle 3 in the article transfer location. A second frame coupling member 80b is disposed remote from the transport vehicle 3 in the article transfer location.

The fixed frame 74 is supported in suspension, with mounting members 77 extending upward from the respective side frame portions 74b and fixed at upper ends thereof to two frame supports 76 by metal fittings. The frame supports 76 are supported as suspended from the ceiling by suspender bolts 75, and extend along the guide rail 2. In this way, the fixed frames 74 are supported as suspended from the ceiling. Each fixed frame 74 may be installed or removed by attaching or detaching the mounting members 77 to/from the frame supports 76. Thus, when carrying various equipment for article processing into or out of the article processing units 1, a required number of fixed frames 74 may be removed so that the fixed frames 74 do not obstruct movement of the equipment carried in or out. Moreover, an operation to remove the fixed frames 74 and a subsequent operation to install the fixed frames 74 may be carried out with ease.

The slide guide mechanism 70 includes rails 78 formed on the fixed frame 74, and guide rollers 79 formed on the upper end portions 69c of the suspension supports 69 to be guided by the rails 78, for slidably supporting the upper end portions 69c of the suspension supports 69.

The rails 78 are formed on the pair of side frame portions 74a of the fixed frame 74, respectively. The guide rollers 79 include three types of rollers, i.e. first guide rollers 79a guided by upper surfaces of the rails 78, second guide rollers 79b guided by lower surfaces of the rails 78, and third guide rollers 79c guided by side surfaces of the rails 78. The upper end portion 69c of each suspension support 69 has the first guide rollers 79a and second guide rollers 79b forming pairs of upper and lower guide rollers which, along with the third guide rollers 79c, form two sets spaced apart in the direction toward and away from the transport vehicle 3 standing still in the article transfer location.

As in the second embodiment described hereinbefore, the fixed frame 74 includes an operated element 82 supported to be movable toward and away from the transport vehicle 3 standing still in the article transfer location. The operated element 82 is linked with the slide guide mechanism 70 such that the operated element 82, when in a proximate position close to the transport vehicle 3 in the article transfer location, operates the article support 68 to the article transfer position, and when in a remote position away from the transport vehicle 3, operates the article support 68 to the article storage position.

The operated element 82 is pivotable, with a longitudinally middle part thereof pivotally connected to a plate-like base 90 mounted on the first frame coupling member 80*a*. The base 90 is disposed inwardly of one side frame portion 74*a*. The operated element 82 is disposed within a width, in the longitudinal direction of the guide rail 2, of the article support 68 located in the article storage position.

The fixed frame 74 includes a linkage mechanism 83 for linking movement of the operated element 82 and movement of the article support 68 such that, when the operated element 82 is located in the proximate position, the article support 68 is located in the article storage position, and when the operated element 82 is located in the remote position, the article support 68 is located in the article transfer position. The linkage mechanism 83 includes three link arms, i.e. a first link arm 85, a second link arm 86 and a third link arm 87, pivotable about vertical axes for linking movement of the operated element 82 and movement of a linking operated element 84 erected on the suspension coupling frame 81.

The first link arm 85 has one end thereof pivotally connected to one end of the operated element 82, and the other end pivotally connected to a longitudinally intermediate position of the second link arm 86. The second link arm 86 has one end thereof pivotally connected to the base 90, and the other end pivotally connected to one end of the third link arm 87. The third link arm 87 has the other end pivotally connected to the linking operated element 84.

By rocking movement about a pivot axis 100, the operated element 82 is switchable between the proximate position and remote position. The operated element 82 has an end region 82*a* thereof which, in the proximate position, is located closer than the pivot axis 100 to the transport vehicle 3 standing still in the article transfer location. The end region 82*a* of the operated element 82 has a groove 101 formed therein. When the operated element 82 is located in the proximate position, the groove 101 extends toward the pivot axis 100 along a direction crossing the direction toward and away from the transport vehicle 3 in the article transfer location. The groove 101 is open in the direction toward and away from the transport vehicle 3.

As in the second embodiment described hereinbefore, the transport vehicle 3 includes a operating element 102 movable to project from the transport vehicle 3 for operating the operated element 82 from the proximate position to the remote position, and movable to retract to the transport vehicle 3 for operating the operated element 82 from the remote position to the proximate position.

In the third embodiment, the operating element 102 has an engaging roller 102*a* as an engaging element movable toward and away from the transport vehicle 3 standing still in the article transfer location, and engageable with the groove 101 of the operated element 82. With movement of the engaging roller 102*a* to project from the transport vehicle 3, the engaging roller 102*a* engages the groove 101 to push the operated element 82 from the proximate position to the remote position. With movement of the engaging roller 102*a* to retract to the transport vehicle 3, the operated element 82 is pulled from the remote position to the proximate position. Subsequently, the engaging roller 102*a* is disengaged from the groove 101. This construction constitutes a push-pull type operating means.

To describe this construction further, the operated element 82 is mounted on the base 90 to be pivotable about the pivot axis 100 located between the end region 82*a* and an opposite end region 82*b*. The first link arm 85 of the linkage mechanism 83 is pivotally connected to the end of the other end region 82*b* of the operated element 82. With rocking movement about the pivot axis 100 of the operated element 82, the end region 82*a* and opposite end region 82*b* are movable opposite to each other in the direction toward and away from the transport vehicle 3 standing still in the article transfer location.

When in the proximate position, the operated element 82 extends along a direction crossing the direction toward and away from the transport vehicle 3, with the end region 82*a* having approached the transport vehicle 3 in the article transfer location, and the other end region 82*b* having moved away from the transport vehicle 3 in the article transfer location. When in the remote position, the operated element 82 extends along a direction crossing the direction toward and away from the transport vehicle 3, with the end region 82*a* having moved away from the transport vehicle 3 in the article transfer location, and the other end region 82*b* having approached the transport vehicle 3 in the article transfer location.

The groove 101 formed in the end region 82*a* of the operated element 82 includes a distal side straight portion 101*a* which, in the state of the operated element 82 being located in the proximate position as shown in FIG. 20, has a tip end opening in the direction toward and away from the transport vehicle 3 in the article transfer location, and a proximal side straight portion 101*b* continuous from the distal side straight portion 101*a* and extending longitudinally of the operated element 82 and along a direction crossing the direction toward and away from the transport vehicle 3, as far as the pivot axis 100.

The engaging roller 102*a* of the operating element 102 is attached, to be rotatable about a vertical axis, to a distal end of the operating element 102 extendible and retractable relative to the transport vehicle 3. The engaging roller 102*a* has a diameter almost the same as or slightly smaller than the breadth of the groove 101.

Movements of the operating element 102 and operated element 82 will be described.

An operation for moving the operated element 82 from the proximate position to the remote position will be described first. When the operated element 82 is located in the proximate position as shown in FIG. 20, the distal side straight portion 101*a* of the groove 101 is open in the direction toward and away from the transport vehicle 3. The engaging roller 102*a* moving to project from the transport vehicle 3 enters the opening of the distal side straight portion 101*a* of the groove 101 and fits into and engages the groove 101. The engaging roller 102*a* engaging the groove 101 moves to project from the transport vehicle 3. Thus, the engaging roller 102*a* moves to the proximal side straight portion 101*b* while pressing a side wall of the groove 101, thereby pushing the operated element 82 from the proximate position to the remote position.

An operation for moving the operated element 82 from the remote position to the proximate position will be described next. The engaging roller 102*a* engaging the groove 101 moves to retract to the transport vehicle 3. Thus, the engaging roller 102*a* moves to the distal side straight portion 101*a* while pressing a side wall of the groove 101, thereby pushing the operated element 82 from the remote position to the proximate position. When the operated element 82 is located in the proximate position, the distal side straight portion 101*a* of the groove 101 is open in the direction toward and away from the transport vehicle 3. Thus, the engaging roller 102*a* disengages from the groove 101 through the opening of the distal side straight portion 101*a* of the groove 101.

A retaining device 103 is provided for retaining the article support 68 in the article storage position. With the retaining device 103 retaining the article support 68 in the article storage position, when the article support 68 is located in the article storage position, the article support 68 is prevented from inadvertently moving toward the article transfer position even if a force acts to move the article support 68 to the article transfer position, apart from the push of the operating element 102.

The retaining device 103 includes a restrictor 104 for restricting the rocking of the operated element 82 to one direction, and the linkage mechanism 83 linking the article support 68 and operated element 82 such that, when a force acts to move to the article support 68 to the article transfer position, the operated element 82 is rocked to the side regulated by the restrictor 104.

To describe this construction further, the operated element 82 is rocked about the pivot axis 100 when pushed by the operating element 102, and therefore the restrictor 104 contacts the operated element 82 to stop the rocking of the operated element 82 in the opposite direction to the rocking by the operating element 102. As shown in FIGS. 20 and 21, the pushing operation of the operating element 102 rocks the operated element 82 counterclockwise. As shown in FIG. 20, the restrictor 104 is mounted on the base 90 to be downstream, in the clockwise direction, of the operated element 82 located in the proximate position. When the operated element 82 located in the proximate position rocks clockwise, the restrictor 104 contacts the operated element 82 to stop the clockwise rocking of the operated element 82.

When a force acts to move the article support 68 located in the article storage position to the article transfer position, the linking operated element 84 will move toward the transport vehicle 3 standing still in the article transfer location. Thus, when the article support 68 is located in the article storage position, the linkage mechanism 83 has the second link arm 86 and third link arm 87 connected as flexed away from the transport vehicle 3 in the article transfer location. Consequently, the operated element 82 is rocked clockwise when the linking operated element 84 moves toward the transport vehicle 3 in the article transfer location.

Thus, when a force acts to move the article support 68 toward the article transfer position, the linkage mechanism 83 and restrictor 104 can restrict the rocking of the operated element 82 to retain the article support 68 in the article storage position.

The motion occurring when switching the article support 68 between the article storage position and article transfer position will be described.

As shown in FIGS. 18 and 20, the operated element 82 is held in the proximate position by the retaining device 103. At this time, the article support 68 is located in the article storage position by linking action of the linkage mechanism 83.

After the transport vehicle 3 stops at the article transfer location, the operating element 102 is slid to project from the transport vehicle 3 by operation of the actuator. The engaging roller 102a of the operating element 102 is engaged with the groove 101 to push the operated element 82 from the proximate position to the remote position. The movement of the operated element 82 from the proximate position to the remote position rocks the first to third link arms 85-87 about the vertical axes, thereby operating the linking operated element 84 toward the transport vehicle 3 in the article transfer location. As a result, the article support 68 is switched from the article storage position to the article transfer position as shown in FIGS. 19 and 21. At this time, since the slide guide mechanism 70 slidably suspends and supports the upper end portions 69c of the supports 69, the article support 68 moves horizontally from the article storage position to the article transfer position as supported in suspension by the fixed frame 74.

After the article support 68 is switched from the article storage position to the article transfer position, the operating element 108 is moved to retract to the transport vehicle 3 by operation of the actuator. The engaging roller 102a of the operating element 102 is engaged with the groove 101, and the operated element 82 is pulled to rock from the remote position to the proximate position. When the operated element 82 is located in the proximate position, the engaging roller 102a of the operating element 102 is disengaged from the groove 101. The rocking of the operated element 82 from the remote position to the proximate position rocks the first to third link arms 85-87 about the vertical axes, thereby operating the linking operated element 84 away from the transport vehicle 3 in the article transfer location. The article support 68 is moved from the article transfer position to the article storage position. At this time, since the slide guide mechanism 70 slidably suspends and supports the upper end portions 69c of the supports 69, the article support 68 moves horizontally from the article transfer position to the article storage position as supported in suspension by the fixed frame 74.

Other Embodiments (1) In the first and second embodiments described hereinbefore, the operating means is exemplified by the pressing operating elements 37 and 58 of the pressing type. In the third embodiment, the operating means is exemplified by the operating element 102 of the push-pull type. The type of operating means may be varied as appropriate.

For example, an operating means of the pull type may be employed. In this case, a resilient element is provided for biasing the operated element 32, 56 or 82 back to the remote position. The operating means is moved to project from the transport vehicle 3 and then moved to retract to the transport vehicle 3, thereby to pull the operated element 32, 56 or 82 from the remote position to the proximate position against the biasing force of the resilient element. The operation for pulling the operated element 32, 56 or 82 from the remote position to the proximate position is canceled, for allowing the operated element 32, 56 or 82 to return from the proximate position to the remote position.

(2) In the first to third embodiments described hereinbefore, the article supports 29, 42 and 68 in the article transfer position transfer a container 5 to and from the gripper 4 located in a position close to the upper position. For example, the article supports 29, 42 and 68 in the article transfer position may transfer a container 5 to and from the gripper 4 located in the upper position. In this case, the article transfer position is higher than the article storage position, and the support means vertically movably supports the article supports 29, 42 and 68.

The position of the article support 29 for transferring a container 5 to and from the gripper 4 is not limited to the upper position or the position close to the upper position, but may be a position lower by a set height than the upper position. In this case, a container 5 may be transferred between the article support 29 and gripper 4 by lowering the gripper 4 by the set height from the upper position in the state of the article support 29 being located in the article transfer position.

(3) In the first to third embodiments described hereinbefore, a plurality of article supports 29, 42 and 68 are arranged along the guide rail 2. The number of article supports 29, 42 and 68 may be varied as appropriate. While the article supports 29, 42 and 68 are installed at both sides of the guide rail 2, they may be installed only at one side of the guide rail 2.

(4) In the first to third embodiments described hereinbefore, the transport vehicle 3 has two operating means, i.e. the pressing operating element 37 or 58 or operating element 102 movable to project rightward from the transport vehicle 3, and the pressing operating element 37 or 58 or operating element 102 movable to project leftward from the transport vehicle 3, for switching the article supports 29, 42 or 68 arranged at both sides of the guide rail 2 between the article transfer and article storage position. It is possible to provide one operating element movable to project rightward and leftward from the transport vehicle 3, for switching the article supports 29, 42 or 68 arranged at both sides of the guide rail 2 between the article transfer and article storage position. Then, in the first embodiment, the article supports 29 arranged at both sides of the guide rail 2 will have the fixed frames 30 at the same side of the article supports 29 in the longitudinal direction of the guide rail 2.

(5) In the first to third embodiments described hereinbefore, the mobile body is exemplified by the transport vehicle 3 having the gripper 4 capable of gripping a container 5 in suspension, and vertically movable relative to the transport vehicle 3. The construction for holding a container 5 may be varied as appropriate. For example, the transport vehicle may include only a gripper for holding a container 5 by pinching it at opposite sides thereof.

In this case, for example, article transfer stations are arranged at a side of the guide rail 2. Each station has an article transfer device of the extension and retraction type for transfer of articles to and from the transport vehicles 3. In this way, articles may be transferred between the transport vehicle and the station.

(6) In the first embodiment described hereinbefore, the operated element 32 is disposed in the upper position of the fixed frame 30, while the link mechanism 31 is disposed at the lower end of the fixed frame 30. Conversely, the operated element 32 may be disposed at the lower end of the fixed frame 30, with the link mechanism 31 disposed at the upper end of the fixed frame 30.

(7) In the first embodiment described hereinbefore, the linkage mechanism 38 includes the large diameter gear 39, small diameter gear 40 and shaft 41. The construction of the linkage mechanism 38 may be varied as appropriate. It is possible to employ any linkage that links movement of the operated element 32 and movement of the link mechanism 31, for operating the article support 29 to the article storage position when the operated element 32 is in the proximate position, and operating the article support 29 to the article transfer position when the operated element 32 is in the remote position.

(8) In the first to third embodiments described hereinbefore, the article transport facility transports, as articles, containers 5 storing semiconductor substrates. The articles transported may be varied as appropriate.

(9) The non-contact position of the operating means may be a position remote from the contact position in the direction of movement of the transport vehicle 3. That is, the contact position of the operating means need not be in a direction to project from the transport vehicle 3 with respect to the non-contacting position.

What is claimed is:

1. An article transport facility comprising:
   an article transporting mobile body movable along a moving path and having an article holding unit;
   an article support for article storage, the article support movable between an article transfer position and an article storage position, the article transfer position being a position of the article support where an article is transferred from the article holding unit to the article support or from the article support to the article holding unit;
   an operating means provided on said mobile body for moving said article support between said article storage position and said article transfer position when said mobile body is at an article transfer location corresponding to a location of said article support;
   support means for supporting said article support to be movable between said article storage position and said article transfer position; and
   an operated element movable between a first position and a second position;
   wherein said operated element is operatively connected with said support means such that, when said operated element is in said first position, said article support is located in said article storage position, and when said operated element is in said second position, said article support is located in said article transfer position; and
   wherein said operating means comprises an operating element movable between a contact position for contacting said operated element and a non-contact position out of contact with said operated element, such that a movement of said operating element to said contact position causes said operated element to move from said first position to said second position and a movement of said operating element to said non-contact position causes said operated element to move from said second position to said first position.

2. An article transport facility as defined in claim 1, wherein said support means has a link mechanism swingable about vertical axes relative to a fixed frame disposed at a location corresponding to said article storage position.

3. An article transport facility as defined in claim 1, wherein said support means has a slide guide mechanism for supporting said article support to be slidable toward and away from said mobile body stopped in said article transfer location, and relative to a fixed frame disposed at a location corresponding to said article storage position.

4. An article transport facility as defined in claim 3, wherein said article support has suspension support extending upward from the article support, said slide guide mechanism slidably supporting upper ends of said suspension support.

5. An article transport facility as defined in claim 3, wherein said operated element is disposed within a width, in a longitudinal direction of said moving path, of said article support located in said article storage position, and said operating element of said operating means is disposed within a fore and aft width of said mobile body.

6. An article transport facility as defined in claim 1, further comprising a biasing means for biasing said article support back to said article storage position, said operating element, by movement to said contact position, pressing and moving said operated element from said first position to said second position, and by movement to said non-contact position, allowing said biasing means to move said operated element from said second position to said first position.

7. An article transport facility as defined in claim 1, wherein:
   said operated element is pivotable about a pivot axis to switch between said first position and said second position, said operated element having a forward end region which, in said first position, is located closer than said pivot axis to said mobile body located at said article transfer location;

said forward end region of said operated element defines a groove extending toward said pivot axis along a direction that intersects a direction toward and away from said mobile body located at said article transfer location, when said operated element is located at said first position, said groove opening at an end thereof facing said mobile body located at said article transfer location; and said operating element has an engaging element engageable with said groove and movable in said direction toward and away from said mobile body, wherein a movement of said engaging element to said contact position causes said engaging element to engage with said groove and to push said operated element from said first position to said second position, and the movement of said engaging element to said non-contact position allows said operated element to move from said second position to said first position.

8. An article transport facility as defined in claim 7, further comprising a retaining device for retaining said article support in said article storage position.

9. An article transport facility as defined in claim 1, wherein said holding unit mobile body includes:
   a gripper for gripping an article with the article suspended therefrom, said gripper being vertically movable relative to said mobile body; and
   a lift control mechanism for vertically moving the gripper between an upper position adjacent said mobile body and a lower position adjacent an article transfer station disposed below said mobile body;
   wherein said article support in said article transfer position transfers articles to and from said gripper in or adjacent said upper position.

10. An article transport facility as defined in claim 1, wherein a plurality of article supports are arranged along said moving path.

11. An article transport facility as defined in claim 1, wherein said first position and said second position are a location closer to and a location remote from said mobile body located in said article transfer location, respectively.

12. An article transport facility comprising:
   an article transporting mobile body movable along a rail suspended from a ceiling, and having an article holding unit;
   an article support for article storage movable between an article transfer position adjacent said mobile body and an article storage position remote from said mobile body, the article transfer position being a position of the article support where an article is transferred from the article holding unit to the article support or from the article support to the article holding unit;
   a link mechanism for supporting said article support to be movable between said article transfer position and said article storage position;
   an operated element movable between a first position and a second position, said operated element being operatively connected with said link mechanism such that, when said operated element is in said first position, said article support is located in said article storage position, and when said operated element is in said second position, said article support is located in said article transfer position; and
   a operating element provided on said mobile body to be movable between a contact position for contacting said operated element, and a non-contact position out of contact with said operated element, movement of the operating element toward the contact position causes the operated element to move from said first position to said second position, and movement of the operating element toward the non-contact position causes the operated element to move from said second position to said first position.

13. An article transport facility as defined in claim 12, wherein said link mechanism has a first link and a second link pivotable about vertical axes relative to a fixed frame disposed at a location corresponding to said article storage position.

14. An article transport facility as defined in claim 12, wherein said link mechanism has a slide guide mechanism for supporting said article support to be slidable toward and away from said mobile body.

15. An article transport facility as defined in claim 12, wherein said article support is biased by a spring to return to said article storage position.

* * * * *